United States Patent
Sheats et al.

(10) Patent No.: US 8,927,315 B1
(45) Date of Patent: Jan. 6, 2015

(54) HIGH-THROUGHPUT ASSEMBLY OF SERIES INTERCONNECTED SOLAR CELLS

(75) Inventors: James R. Sheats, Palo Alto, CA (US); Werner Dumanski, San Jose, CA (US)

(73) Assignee: aeris CAPITAL Sustainable IP Ltd., Grand Cayman (KY)

( * ) Notice: Subject to any disclaimer, the term of this patent is extended or adjusted under 35 U.S.C. 154(b) by 0 days.

(21) Appl. No.: 13/562,712

(22) Filed: Jul. 31, 2012

Related U.S. Application Data

(63) Continuation of application No. 11/762,043, filed on Jun. 12, 2007, now abandoned, and a continuation-in-part of application No. 11/207,157, filed on Aug. 16, 2005, now Pat. No. 7,838,868, which is a continuation-in-part of application No. 11/039,053, filed on Jan. 20, 2005, now Pat. No. 7,276,724.

(60) Provisional application No. 60/804,559, filed on Jun. 12, 2006, provisional application No. 60/804,562, filed on Jun. 12, 2006.

(51) Int. Cl.
*H01L 21/00* (2006.01)

(52) U.S. Cl.
USPC .......................................... 438/57

(58) Field of Classification Search
None
See application file for complete search history.

(56) References Cited

U.S. PATENT DOCUMENTS

| | | |
|---|---|---|
| 3,423,301 A | 1/1969 | Stearns |
| 3,586,541 A | 6/1971 | Chamberlin |
| 3,818,324 A | 6/1974 | Espinasse |
| 3,903,427 A | 9/1975 | Pack |
| 3,903,428 A | 9/1975 | Dejong |
| 3,966,568 A | 6/1976 | Crossley et al. |
| 4,191,794 A | 3/1980 | Biter et al. |
| 4,192,721 A | 3/1980 | Baranski et al. |

(Continued)

FOREIGN PATENT DOCUMENTS

| | | |
|---|---|---|
| CN | 1036298 A | 10/1989 |
| DE | 2741954 A | 3/1979 |

(Continued)

OTHER PUBLICATIONS

"Global Solar Process" slides 9, 10, 11, 23, 24, presented at the 29th IEEE PVSC, Polycrystalline Thin-Film Solar Cells—Manufacturing Technology, part 2, May 18-25, 2002, New Orleans, LA.

(Continued)

*Primary Examiner* — Seahvosh Nikmanesh
(74) *Attorney, Agent, or Firm* — Joshua D. Isenberg; JDI Patent

(57) ABSTRACT

Methods and devices are provided for high-efficiency solar cells. In one embodiment, an assembly is provided comprising of a plurality of solar cells each having at least one transparent conductor, a photovoltaic layer, at least one bottom electrode, a plurality of emitter wrap through (EWT) vias containing a conductive material, and a plurality of series interconnect vias containing a conductive material. The assembly may also include a backside support coupled to the solar cells, wherein the backside support is patterned to have electrically conductive areas and electrically nonconductive areas that create a series interconnect between solar cells electrically coupled by the support and prevents parallel connections between the solar cells. The cells may have a via insulating layer in each via separating the conductive material in each via from any side walls of the bottom electrode.

10 Claims, 20 Drawing Sheets

(56) References Cited

U.S. PATENT DOCUMENTS

| | | |
|---|---|---|
| 4,227,942 A | 10/1980 | Hall |
| 4,243,432 A | 1/1981 | Jordan et al. |
| 4,404,422 A | 9/1983 | Green et al. |
| 4,485,264 A * | 11/1984 | Izu et al. ............... 136/244 |
| 4,499,658 A | 2/1985 | Lewis |
| 4,511,756 A | 4/1985 | Moeller et al. |
| 4,522,663 A | 6/1985 | Ovshinsky et al. |
| 4,536,607 A | 8/1985 | Wiesmann |
| 4,574,160 A | 3/1986 | Cull et al. |
| 4,590,327 A * | 5/1986 | Nath et al. ............... 136/256 |
| 4,622,432 A | 11/1986 | Yamazaki |
| 4,642,140 A | 2/1987 | Noufi et al. |
| 4,677,250 A | 6/1987 | Barnett et al. |
| 4,755,475 A | 7/1988 | Kiyama et al. |
| 4,786,607 A | 11/1988 | Yamazaki et al. |
| 4,806,436 A | 2/1989 | Tada et al. |
| 4,849,029 A | 7/1989 | Delahoy |
| 4,860,509 A | 8/1989 | Laaly et al. |
| 4,865,999 A | 9/1989 | Xi et al. |
| 4,872,925 A | 10/1989 | Mcmaster |
| 4,914,276 A | 4/1990 | Blair |
| 4,940,604 A | 7/1990 | Suyama et al. |
| 4,981,525 A * | 1/1991 | Kiyama et al. ............... 136/244 |
| 5,045,409 A | 9/1991 | Eberspacher et al. |
| 5,057,163 A | 10/1991 | Barnett et al. |
| 5,078,804 A | 1/1992 | Chen et al. |
| 5,093,453 A | 3/1992 | St. Clair et al. |
| 5,139,959 A | 8/1992 | Craft et al. |
| 5,141,564 A | 8/1992 | Chen et al. |
| 5,244,509 A | 9/1993 | Arao et al. |
| 5,254,179 A | 10/1993 | Ricaud et al. |
| 5,268,037 A | 12/1993 | Glatfelter |
| 5,277,786 A | 1/1994 | Kawakami |
| 5,286,306 A | 2/1994 | Menezes |
| 5,356,839 A | 10/1994 | Tuttle et al. |
| 5,401,573 A | 3/1995 | Babel et al. |
| 5,419,781 A | 5/1995 | Hamakawa et al. |
| 5,421,908 A | 6/1995 | Yoshida et al. |
| 5,436,204 A | 7/1995 | Albin et al. |
| 5,441,897 A | 8/1995 | Noufi et al. |
| 5,445,847 A | 8/1995 | Wada et al. |
| 5,468,652 A | 11/1995 | Gee |
| 5,501,744 A | 3/1996 | Albright et al. |
| 5,538,903 A | 7/1996 | Aramoto et al. |
| 5,547,516 A | 8/1996 | Luch |
| 5,578,503 A | 11/1996 | Karg et al. |
| 5,587,264 A | 12/1996 | Iijima et al. |
| 5,626,686 A | 5/1997 | Yoshida |
| 5,626,688 A | 5/1997 | Probst et al. |
| 5,633,033 A | 5/1997 | Nishitani et al. |
| 5,637,537 A | 6/1997 | Nath et al. |
| 5,667,596 A | 9/1997 | Tsuzuki et al. |
| 5,674,325 A | 10/1997 | Albright et al. |
| 5,677,250 A | 10/1997 | Knapp |
| 5,679,176 A | 10/1997 | Tsuzuki et al. |
| 5,681,402 A | 10/1997 | Ichinose et al. |
| 5,728,231 A | 3/1998 | Negami et al. |
| 5,730,852 A | 3/1998 | Bhattacharya et al. |
| 5,733,381 A | 3/1998 | Ota et al. |
| 5,735,966 A | 4/1998 | Luch |
| 5,759,291 A | 6/1998 | Ichinose et al. |
| 5,865,904 A | 2/1999 | Tanda |
| 5,868,869 A | 2/1999 | Albright et al. |
| 5,897,715 A | 4/1999 | Ward et al. |
| 5,925,228 A | 7/1999 | Panitz et al. |
| 5,928,439 A | 7/1999 | Ota et al. |
| 5,951,786 A | 9/1999 | Gee et al. |
| 5,994,163 A | 11/1999 | Bodegaard et al. |
| 6,034,322 A | 3/2000 | Pollard |
| 6,034,810 A | 3/2000 | Robinson et al. |
| 6,072,117 A | 6/2000 | Matsuyama et al. |
| 6,083,801 A | 7/2000 | Ohtani |
| 6,107,562 A | 8/2000 | Hashimoto et al. |
| 6,121,541 A | 9/2000 | Arya |
| 6,124,039 A | 9/2000 | Goetz et al. |
| 6,127,202 A | 10/2000 | Kapur et al. |
| 6,130,465 A | 10/2000 | Cole |
| 6,201,181 B1 | 3/2001 | Azzam et al. |
| 6,239,352 B1 | 5/2001 | Luch |
| 6,265,652 B1 | 7/2001 | Kurata et al. |
| 6,268,014 B1 | 7/2001 | Eberspacher et al. |
| 6,333,206 B1 | 12/2001 | Ito et al. |
| 6,359,209 B1 | 3/2002 | Glenn et al. |
| 6,372,538 B1 | 4/2002 | Wendt et al. |
| 6,414,235 B1 | 7/2002 | Luch |
| 6,429,369 B1 | 8/2002 | Tober et al. |
| 6,437,231 B2 | 8/2002 | Kurata et al. |
| 6,455,347 B1 | 9/2002 | Hiraishi et al. |
| 6,459,032 B1 | 10/2002 | Luch |
| 6,468,828 B1 | 10/2002 | Glatfelter et al. |
| 6,511,861 B2 | 1/2003 | Takeyama et al. |
| 6,553,729 B1 | 4/2003 | Nath et al. |
| 6,573,445 B1 | 6/2003 | Burgers |
| 6,729,081 B2 | 5/2004 | Nath et al. |
| 6,750,662 B1 | 6/2004 | Van Der |
| 6,774,497 B1 | 8/2004 | Qi et al. |
| 6,787,405 B2 | 9/2004 | Chen |
| 6,803,513 B2 | 10/2004 | Beernink et al. |
| 6,846,696 B2 | 1/2005 | Adachi et al. |
| 6,974,976 B2 | 12/2005 | Hollars |
| 7,053,294 B2 | 5/2006 | Tuttle et al. |
| 7,091,136 B2 | 8/2006 | Basol |
| 7,122,398 B1 | 10/2006 | Pichler |
| 7,144,751 B2 | 12/2006 | Gee et al. |
| 7,170,001 B2 | 1/2007 | Gee et al. |
| 7,258,895 B2 | 8/2007 | Sandhu |
| 7,276,724 B2 | 10/2007 | Sheats et al. |
| 7,507,903 B2 | 3/2009 | Luch |
| 7,507,971 B2 | 3/2009 | Shibayama et al. |
| 7,521,344 B2 | 4/2009 | Basol |
| 7,635,810 B2 | 12/2009 | Luch |
| 7,732,229 B2 | 6/2010 | Leidholm et al. |
| 7,732,243 B2 | 6/2010 | Luch |
| 7,838,868 B2 | 11/2010 | Sheats et al. |
| 7,919,337 B2 | 4/2011 | Sheats et al. |
| 8,158,450 B1 | 4/2012 | Sheats et al. |
| 8,198,117 B2 | 6/2012 | Leidholm et al. |
| 8,309,163 B2 | 11/2012 | Van Duren et al. |
| 8,541,048 B1 | 9/2013 | Leidholm et al. |
| 8,722,160 B2 | 5/2014 | Sager et al. |
| 2001/0055888 A1 | 12/2001 | Madan et al. |
| 2002/189662 A1 | 12/2002 | Lomparski |
| 2003/0064153 A1 | 4/2003 | Solanki et al. |
| 2003/0103181 A1 | 6/2003 | Imayama et al. |
| 2003/0131793 A1 | 7/2003 | Endo et al. |
| 2003/0198587 A1 | 10/2003 | Kaloyeros et al. |
| 2003/0205270 A1 | 11/2003 | Stanbery |
| 2003/0227021 A1 | 12/2003 | Yamazaki et al. |
| 2004/0069340 A1 | 4/2004 | Luch |
| 2004/0140419 A1 | 7/2004 | Hsieh et al. |
| 2004/0144419 A1 | 7/2004 | Fix et al. |
| 2004/0214409 A1 | 10/2004 | Farnworth et al. |
| 2004/0219730 A1 | 11/2004 | Basol |
| 2004/0261839 A1 | 12/2004 | Gee et al. |
| 2004/0261840 A1 | 12/2004 | Schmit et al. |
| 2005/0006714 A1 | 1/2005 | Graetzel et al. |
| 2005/0058587 A1 | 3/2005 | Wagner |
| 2005/0072457 A1 | 4/2005 | Glenn |
| 2005/0072461 A1 | 4/2005 | Kuchinski et al. |
| 2005/0074915 A1 | 4/2005 | Tuttle et al. |
| 2005/0087225 A1 | 4/2005 | Morooka et al. |
| 2005/0095422 A1 | 5/2005 | Sager et al. |
| 2005/0109392 A1 | 5/2005 | Hollars |
| 2005/0117194 A1 | 6/2005 | Kim et al. |
| 2005/0121068 A1 | 6/2005 | Sager et al. |
| 2005/0126621 A1 | 6/2005 | Dinwoodie et al. |
| 2005/0135724 A1 | 6/2005 | Helvajian et al. |
| 2005/0172897 A1 | 8/2005 | Jansen |
| 2005/0172996 A1 | 8/2005 | Hacke et al. |
| 2005/0172998 A1 | 8/2005 | Gee et al. |
| 2005/0175856 A1 | 8/2005 | Rogers et al. |
| 2005/0176164 A1 | 8/2005 | Gee et al. |
| 2005/0176270 A1 | 8/2005 | Luch |
| 2005/0183767 A1 | 8/2005 | Yu et al. |

(56) References Cited

U.S. PATENT DOCUMENTS

| | | |
|---|---|---|
| 2005/0217719 A1 | 10/2005 | Mahieu et al. |
| 2005/0241692 A1 | 11/2005 | Rubin et al. |
| 2005/0263178 A1 | 12/2005 | Montello et al. |
| 2005/0263179 A1 | 12/2005 | Gaudiana et al. |
| 2005/0263180 A1 | 12/2005 | Montello et al. |
| 2005/0274408 A1 | 12/2005 | Li et al. |
| 2006/0030141 A1 | 2/2006 | Weng et al. |
| 2006/0032752 A1 | 2/2006 | Luch |
| 2006/0107471 A1 | 5/2006 | Spath et al. |
| 2006/0118165 A1 | 6/2006 | Van Roosmalen et al. |
| 2006/0121701 A1 | 6/2006 | Basol |
| 2006/0121748 A1 | 6/2006 | Brieko |
| 2006/0160261 A1 | 7/2006 | Sheats et al. |
| 2006/0165911 A1 | 7/2006 | Basol |
| 2006/0180195 A1 | 8/2006 | Luch |
| 2006/0189155 A1 | 8/2006 | Basol |
| 2007/0166453 A1 | 7/2007 | Van Duren et al. |
| 2007/0186971 A1* | 8/2007 | Lochun et al. ............... 136/256 |
| 2007/0283996 A1 | 12/2007 | Hachtmann et al. |
| 2007/0283997 A1 | 12/2007 | Hachtmann et al. |
| 2007/0295385 A1 | 12/2007 | Sheats et al. |
| 2007/0295386 A1 | 12/2007 | Capps et al. |
| 2007/0295387 A1 | 12/2007 | Adriani et al. |
| 2007/0295388 A1 | 12/2007 | Adriani et al. |
| 2007/0295389 A1 | 12/2007 | Capps et al. |
| 2007/0295390 A1 | 12/2007 | Sheats et al. |
| 2008/0011350 A1 | 1/2008 | Luch |
| 2008/0053519 A1 | 3/2008 | Pearce et al. |
| 2008/0227236 A1 | 9/2008 | Luch |
| 2008/0302413 A1 | 12/2008 | Leidholm et al. |
| 2008/0314433 A1 | 12/2008 | Luch |
| 2009/0107538 A1 | 4/2009 | Luch |
| 2009/0111206 A1 | 4/2009 | Luch |
| 2009/0145551 A1 | 6/2009 | Luch |
| 2009/0169722 A1 | 7/2009 | Luch |
| 2009/0173374 A1 | 7/2009 | Luch |
| 2009/0223552 A1 | 9/2009 | Luch |

FOREIGN PATENT DOCUMENTS

| | | |
|---|---|---|
| EP | 0452588 A | 10/1991 |
| EP | 793277 A | 9/1997 |
| JP | 60000783 | 1/1985 |
| JP | 63249379 | 10/1988 |
| JP | 02051282 | 2/1990 |
| JP | 6289369 | 10/1994 |
| WO | 8904062 A | 5/1989 |
| WO | 9324960 A | 12/1993 |
| WO | 03001602 A | 1/2003 |
| WO | 03007386 | 1/2003 |
| WO | 2004100244 A | 11/2004 |
| WO | 2005006402 A | 1/2005 |
| WO | 2005018007 A | 2/2005 |
| WO | 2005076959 A | 8/2005 |
| WO | 2005076960 A | 8/2005 |
| WO | 2005086633 A | 9/2005 |
| WO | 2006078985 A | 7/2006 |
| WO | 2007022221 A | 2/2007 |

OTHER PUBLICATIONS

"NEDO: Development of Production Technology of Flexible Solar Cells using Plastic Film Substrates", downloaded from the internet <http://www.nedo.go.jp/english/archives/170210/170210.html>, downloaded on Jun. 17, 2005.

A. Duggal et al., "OLEDs for Lighting: New Approaches" in Organic Light-Emitting Materials and Devices VII, edited by Sakya H. Katafi, Paul A. Lane, Proceedings of SPIE vol. 5214 pp. 241-247 (SPIE, Bellingham WA, Feb. 2004).

A. R. Burgers, J.A. Eikelboom, Optimizing Metalization Patterns for Yearly Yield, Conference Record of the Twenty-Sixth IEEE Photovoltaic Specialists Conference, Sep. 29-Oct. 3, 1997 pp. 219-222.

A. Schonecker, D.W.K. Eikelboom, P. Manshanden, M.J.A.A. Goris, G.P. Wyers, et al., Advanced Crystalline Silicon Solar Cell Designs, Final Report of European Commission project, JOR3-CT98-02692, (2001).

A. Schonecker, D.W.K. Eikelboom, P. Manshanden, M.J.A.A. Goris, G.P. Wyers, et al., Ace Designs: The Beauty of Rear Contact Solar Cells, 29th IEEE Photovoltaic Specialists Conference, May 2002.

A. Schonecker, H.H.C. de Moor, A.R. Burgers, A.W. Weeber, J. Hoornstra, et al., An Industrial Multi-Crystalline EWT Solar Cell With Screen Printed Metallisation, 14th Eur. Photovoltaic Solar Energy Conference and Exhibition, Barcelona, Spain, (1997).

A.R. Burgers, How to Design Optimal Metallisation Patterns for Solar Cells, Prog. Photovolt: Res. Appl. 7, 457-461 (1999).

A.R. Burgers, J.H. Bultman, A.C. Tip, W.C. Sinke, Metallisation Patterns for Interconnection Through Holes, Solar Energy Materials & Solar Cells 65 (2001) 347-353.

Akahiro Takano, Tomoyoshi Kamoshita, Light-Weight andLarge-Area Solar Cell Production Technology, Japanese Journal of Applied Physics, vol. 43, No. 12, 2004, pp. 7976-7983.

Yukimi Ichikawa, Shinji Fujikake, Katsuya Tabuchi, Toshiaki Sasaki, Toshio Hama, Takashi Yoshida, Hiroshi Sakai, Misao Saga, Flexible A-Si Based Solar Cells with Plastic Film Substrate, Mst. Res. Soc. Symp. Proc. vol. 557. (1999) p. 703-712.

Bultman, J.H.; Eikelboom, D.W.K.; Kinderman, R.; Tip, A.C.; Weeber, A.W.; Meuwissen, M.H.H.; Nieuwenhof, M.A.C.J. Van Den; Michiels, P.P.; Schoofs, C.; Schuurmans, F.M., Selecting optimal interconnection methodology for easy and cost efficient Manufacturing of the pin up module ECN-RX-02-051; Oct. 2002; 4 pages; Presented at PV in Europe—From PV Technology to Energy Solutions Conference and Exhibition, Rome, Italy, Oct. 7-11, 2002.

Chinese Office Action from CN Patent Application No. 200680006141.8.

Contreras et al."High Efficiency Cu (In, Ga)Se2—Based Solar Cells: Processing of Novel Absorber Structures" First WCPEC; Hawaii, Dec. 5-9, 1994, pp. 68-74.

U.S. Appl. No. 11/460,613, to Philip Capps, filed Jul. 27, 2006.
U.S. Appl. No. 11/745,430, to Paul M. Adriani, filed May 7, 2007.
U.S. Appl. No. 14/274,527, to Brian M. Sager, filed May 9, 2014.
U.S. Appl. No. 60/746,626, to Paul Adriani, filed May 5, 2006.
U.S. Appl. No. 60/746,629, to Paul Adriani, filed May 5, 2006.
U.S. Appl. No. 60/746,961, to James R. Sheats, filed May 10, 2006.
U.S. Appl. No. 60/804,570, to Paul Adriani, filed Jun. 12, 2006.
U.S. Appl. No. 60/804,571, to Paul Adriani, filed Jun. 12, 2006.
U.S. Appl. No. 60/806,096, to Paul M. Adriani, filed Jun. 26, 2006.
U.S. Appl. No. 61/052,628, to James R. Sheets, filed May 12, 2008.

David D. Smith, James M. Gee, Review of Back Contact Silicon Solar Cells for Low Cost Application, 16th European Photovoltaic Solar Energy Conference, Glasgow, May 2000.

E. Van Kerschaver, C. Allebe, G. Beaucarne, Optimized Adaptive Back Contacted Solar Cells, 19th EPVSEC, Paris, Jun. 2004.

E. Van Kerschaver, S. De Wolf, C. Allebe, J. Szlufcik, High Performance Modules Based on Back Contacted Solar Cells, 17th Dur. PV Solar Energy Conf., Munich, Germany, Oct. 200 I.

Eikelboom, D.W.K.; Bultman, J.H.; Schonecker, A.; Meuwissen, M.H.H.; Nieuwenhof, M.A.C.J. Van Den; Meier, D.L., Conductive adhesives for low-stress interconnection ofthin back-contact solar cells ECN-RX—02-052; Oct. 2002; 4 pages; Presented at PV in Europe—From PV Technology to Energy Solutions Conference and Exhibition, Rome, Italy, Oct. 7-11, 2002.

Eikelboom, D.W.K.; Burgers, A.R.; Goris, M.J.A.A.; Manshanden, P.; Schonecker, A. Wyers, G.P., Conductive adhesives for interconnection ofbusbarless emitter wrap-through solar cells on a structured metal foil, ECN-RX—01-016; Oct. 2001; 4 pages; Presented at 17th European Photovoltaic Solar Energy Conference, Munich, Germany, Oct. 22-26, 2001.

Final Office Action for U.S. Appl. No. 11/762,043, dated Aug. 4, 2011.

Final Office Action for U.S. Appl. No. 12/060,193, dated Aug. 18, 2010.

Final Office Action for U.S. Appl. No. 12/763,146, dated Apr. 12, 2013.

Final Office Action for U.S. Appl. No. 12/978,801, dated Dec. 31, 2013.

(56) References Cited

OTHER PUBLICATIONS

Final Office Action for U.S. Appl. No. NSL-0150 dated Jul. 11, 2014.
H. Knauss, P. Fath, W. Jooss, M. McCann, E. Ruland, S. Steckemetz, Large Area Metallisation Wrap Through Solar Cells With Thickfilm Metallisation, 20th European Solar Energy Conference and Exhibition, Jun. 6-10, 2005 Barcelona, Spain.
H. Knauss, W. Jooss, S. Roberts, T.M. Bruton, R. Toelle, P. Fath, E. Bucher, Emitter Wrap Through Solar Cells using Electroless Plating Metallisation, 17th European PVSEC, Oct. 2001 Paper VC3-9.
International Search Report and Written Opinion for International Application No. PCT/US2006/031906, dated Aug. 10, 2007.
J. Jay Wimer in "3-D Chip Scale with Lead-Free Processes" in Semiconductor International, Oct. 1, 2003.
J.H. Bultman, A.W. Weeber, M.W. Brieko, J. Hoonstra, et al., Pin Up Module: A Design for Higher. Efficiency, Easy Module Manufacturing and Attractive Appearance, ECN-RX—OO-OIO; May 2000; 4 pages; Presented at 16th European Photovoltaic Solar Energy Conference and Exhibition, Glasgow, Scotland, May 1-5, 2000.
J.H. Bultman, D.W.K. Eikelboom, R. Kinderman, A.C. Tip, C.J.J. Tool, et al., Fast and Easy Single Step Module Assembly for Back-Contacted C-Si Solar Cells with Conductive Adhesives, Proceedings of 3rd World Conference on Photovoltaic Energy Conversion, 2003, Publication Date: May 11-18, 2003 vol. I, pp. 979-982 vol. 1.
J.H. Bultman, M.W. Brieko, A.R. Burgers, J. Hoornstra, A.C. Tip, A.W. Weeber, Interconnection Through Vias for Improved Efficiency and Easy Module Manufacturing of Crystalline Silicon Solar Cells, Solar Energy Materials & Solar Cells 65 (2001) 339-345.
James M. Gee, Stephan E. Garrett, William P. Morgan, Simplified Module Assembly Using Back-Contact Crystalline-Silicon Solar Cells, Conference Record of the Twenty-Sixth IEEE Photovoltaic Specialists Conference, Sep. 29-Oct. 3, 1997.
K. Tabuchi, S. Fujikake, H. Sato, S. Saito, A. Takano, T. Wada, T. Yoshida, Y. Ichikawa, H. Sakai, F. Natsume, Improvement of Large-Area Scaf Structure A-Si Solar Cells with Plastic Film Substrate, Conference Record of the Twenty-Sixth IEEE Photovoltaic Specialists Conference, Sep. 29-Oct. 3, 1997.
Kray, et al, "High-Efficiency Emitter-Wrap-Through Cells", 17.sup.th EU-PVSEC Munich (2001), Oct. 2001.
Miasole Solution from http://www.miasole.com/solution/asp, 2003.
Nanu et al. CuInS2-TiO2 heterojunctions solar cells obtained by atomic layer deposition, Thin Solid Films, 431-432 (2003) 492-496.
Non-Final Office Action for U.S. Appl. No. 11/278,645, dated Jun. 7, 2013.
Non-Final Office Action for U.S. Appl. No. 11/039,053, dated Jan. 5, 2007.
Non-Final Office Action for U.S. Appl. No. 11/207,157, dated Apr. 21, 2010.
Non-Final Office Action for U.S. Appl. No. 11/207,157, dated Jul. 29, 2008.
Non-Final Office Action for U.S. Appl. No. 11/207,157, dated Sep. 27, 2007.
Non-Final Office Action for U.S. Appl. No. 11/740,915, dated Jun. 20, 2013.
Non-Final Office Action for U.S. Appl. No. 11/762,043, dated Dec. 21, 2010.
Non-Final Office Action for U.S. Appl. No. 12/060,193, dated Dec. 8, 2009.
Non-Final Office Action for U.S. Appl. No. 12/464,835, dated Jan. 30, 2014.
Non-Final Office Action for U.S. Appl. No. 12/978,801, dated Mar. 7, 2013.
Non-Final Office Action for U.S. Appl. No. 13/442,771, dated Aug. 7, 2013.
Non-Final Office Action for U.S. Appl. No. 13/465,084, dated Jun. 17, 2013.
Non-Final Office Action for U.S. Appl. No. 13/602,023, dated Mar. 14, 2013.
Non-Final Office Action for U.S. Appl. No. 13/673,993, dated Sep. 19, 2013.
Notice of Allowance for U.S. Appl. No. 11/395,668, dated Jul. 12, 2012.
Notice of Allowance for U.S. Appl. No. 11/765,436, dated Jul. 3, 2013.
Notice of Allowance for U.S. Appl. No. 12/175,945, dated Jun. 2, 2014.
Notice of Allowance for U.S. Appl. No. 12/763,146, dated Dec. 30, 2013.
P.C. De Jong, D.W.K. Eikelboom, R. Kinderman, A.C. Tip, J.H. Bultman, M.H.H. Meuwissen, Mac. J. Van Den Nieuwenhof, "Single-Step Laminated Full-Size PV Modules Made with Back-Contacted me-SI Cells and Conductive Adhesives," 19th EPVSEC, Paris, Jun. 2004.
Pearnchob et al. "Coating of pellets with micronized ethylcellulose particlesby dry powder coating technique" International Journal of Pharmaceutics 268 (2003) 1-11).
Rudmann et al." Efficiency Enhancement of Cu(In,Ga) Set Solar Cells Due to Post-deposition Na Incorporation" Applied Physics Letters vol. 84 No. 7, Feb. 16, 2004, pp. 1129-1131.
Voorwinden et al. In-line Cu(In,Ga)Se2 co-evaporation processes with graded band gaps on large substrates, thin Solid Films, 431-432 (2003) 538-542.
Shinji Fujikake, Masayoshi Uno, Shinji Iwasaki, Yukiotakeda, Takehito Wada, Masayuki Tanda, Akihirotakano, Takashi Yoshida, Fabrication Technologies for Large-Area Plastic-Film-Substrate Solar Cells, Proceedings of 3rd World Conference on Photovoltaic Energy Conversion, 2003, vol. 2, Issue, May 12-16, 2003 pp. 1760-1763 vol. 2.
T. Yoshida, S. Fujikake, S. Kato, M. Tanda, K. Tabuchi, A. Takano, Y. Ichikawa, H. Sakai, Development of Process Technologies for Plastic-film Substrate Solar Cells, Solar Energy Materials and Solar Cells 48 (1997) 383-391.
U.S. Appl. No. 11/278,648, to James R. Sheats, filed Apr. 4, 2006.
U.S. Appl. No. 11/762,040, to Werner Dumanski, filed Jun. 12, 2007.
U.S. Appl. No. 11/762,043, to James R. Sheats, filed Jun. 12, 2007.
U.S. Appl. No. 11/762,048, to Paul Adriani, filed Jun. 12, 2007.
U.S. App. No. 60/804,559, to Werner Dumanski, filed Jun. 12, 2006.
U.S. Appl. No. 60/804,562, to James R. Sheats, filed Jun. 12, 2006.
Non-Final Office Action for U.S. Appl. No. 12/060,193, dated Nov. 6, 2014.
Notice of Allowance for U.S. Appl. No. 12/978,801, dated Oct. 22, 2014.

\* cited by examiner

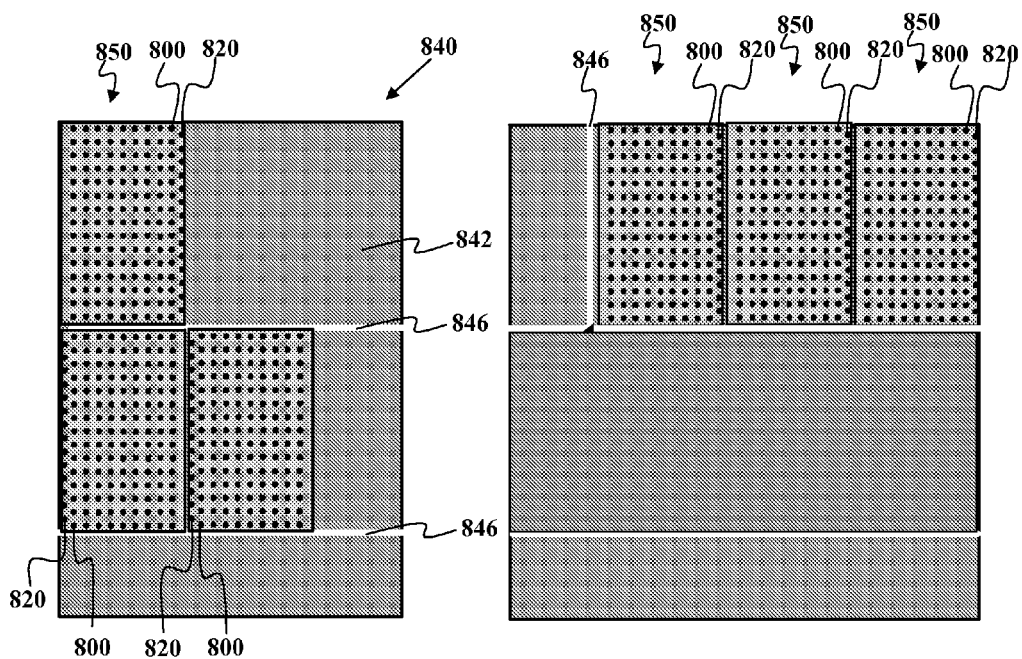
FIG. 21  FIG. 22

HIGH-THROUGHPUT ASSEMBLY OF SERIES INTERCONNECTED SOLAR CELLS

CROSS-REFERENCES TO RELATED APPLICATIONS

This application is a continuation of U.S. patent application Ser. No. 11/762,043 entitled "HIGH-THROUGHPUT ASSEMBLY OF SERIES INTERCONNECTED SOLAR CELLS" filed Jun. 12, 2007 which claims the benefit of priority to U.S. Provisional Application Nos. 60/804,559 and 60/804,562 both filed on Jun. 12, 2006 and is a continuation-in-part of commonly-assigned, U.S. patent application Ser. No. 11/207,157 entitled "OPTOELECTRONIC ARCHITECTURE HAVING COMPOUND CONDUCTING SUBSTRATE" filed Aug. 16, 2005, now U.S. Pat. No. 7,838,868 issued on Nov. 23, 2010, which is a continuation-in-part of commonly-assigned, U.S. patent application Ser. No. 11/039,053 entitled "SERIES INTERCONNECTED OPTOELECTRONIC DEVICE MODULE ASSEMBLY" filed Jan. 20, 2005, now U.S. Pat. No. 7,276,724 issued on Oct. 2, 2007. The entire disclosures of the above applications are fully incorporated herein by reference for all purposes.

FIELD OF THE INVENTION

This invention relates to optoelectronic devices and more particularly to mass-manufacture of optoelectronic devices such as solar cells.

BACKGROUND OF THE INVENTION

Optoelectronic devices can convert radiant energy into electrical energy or vice versa. These devices generally include an active layer sandwiched between two electrodes, sometimes referred to as the front and back electrodes, at least one of which is typically transparent. The active layer typically includes one or more semiconductor materials. In a light-emitting device, e.g., a light-emitting diode (LED), a voltage applied between the two electrodes causes a current to flow through the active layer. The current causes the active layer to emit light. In a photovoltaic device, e.g., a solar cell, the active layer absorbs energy from light and converts this energy to electrical energy exhibited as a voltage and/or current between the two electrodes. Large scale arrays of such solar cells can potentially replace conventional electrical generating plants that rely on the burning of fossil fuels. However, in order for solar cells to provide a cost-effective alternative to conventional electric power generation the cost per watt generated must be competitive with current electric grid rates. Currently, there are a number of technical challenges to attaining this goal.

Most conventional solar cells rely on silicon-based semiconductors. In a typical silicon-based solar cell, a layer of n-type silicon (sometimes referred to as the emitter layer) is deposited on a layer of p-type silicon. Radiation absorbed proximate the junction between the p-type and n-type layers generates electrons and holes. The electrons are collected by an electrode in contact with the n-type layer and the holes are collected by an electrode in contact with the p-type layer. Since light must reach the junction, at least one of the electrodes must be at least partially transparent. Many current solar cell designs use a transparent conductive oxide (TCO) such as indium tin oxide (ITO) as a transparent electrode.

One problem associated with existing solar cells arises from the fact that individual optoelectronic devices produce only a relatively small voltage. Thus, it is often necessary to electrically connect several devices together in series in order to obtain higher voltages in order to take advantage of the efficiencies associated with high voltage, low current operation (e.g. power transmission through a circuit using relatively higher voltage, which reduces resistive losses that would otherwise occur during power transmission through a circuit using relatively higher current).

Another problem associated with existing solar cell designs relates to the series interconnection of optoelectronic devices and the high electrical resistivity associated with the TCO used in the transparent electrode. The high resistivity restricts the size of the individual cells that are connected in series. To carry the current from one cell to the next the transparent electrode is often augmented with a conductive grid of busses and fingers formed on a TCO layer. However, the fingers and busses produce shadowing that reduces the overall efficiency of the cell. In order for the efficiency losses from resistance and shadowing to be small, the cells must be relatively small. Consequently, a large number of small cells must be connected together, which requires a large number of interconnects and more space between cells. Arrays of large numbers of small cells are relatively difficult and expensive to manufacture. Further, with flexible solar modules, shingling is also disadvantageous in that the interconnection of a large number of shingles is relatively complex, time-consuming and labor-intensive, and therefore costly during the module installation process.

A still further problem associated with existing solar cell designs relates to the limited techniques available to assemble of modules containing conventional solar cells. The techniques used to assemble these cells and modules remains labor intensive and does not lend itself to highly automated production. To create a series interconnection between cells, it is often necessary to connect the bottom electrode of one cell to the top electrode of another cell. Unfortunately, creating this type of interconnect using conventional solar cell designs slows the manufacturing process and limits the ability to increase the production throughput of factories using such cells.

Thus, there is a need in the art, for an optoelectronic device architecture that overcomes the above disadvantages and a corresponding method to manufacture and assemble such cells in a high-throughput manner.

SUMMARY OF THE INVENTION

Embodiments of the present invention address at least some of the drawbacks set forth above. The present invention provides devices and methods that allow for high-throughput assembly of solar cell modules. The methods of the present invention may streamline the process and reduce the number of steps or combine steps used to assemble the resulting module. At least some of these and other objectives described herein will be met by various embodiments of the present invention.

In one embodiment of the present invention, an assembly is provided comprising of a plurality of solar cells each having at least one transparent conductor, a photovoltaic layer, at least one bottom electrode, a plurality of emitter wrap through (EWT) vias containing a conductive material, and a plurality of series interconnect vias containing a conductive material. The assembly may also include a backside support coupled to the solar cells, wherein the backside support is patterned to have electrically conductive areas and electrically nonconductive areas that create a series interconnect between solar cells electrically coupled by the support and prevents parallel connections between the solar cells. The cells may have a via insulating layer in each via separating the conductive material in each via from any side walls of the bottom electrode.

For any of the embodiments described herein, the following may also apply. The electrically nonconductive areas on the backside support may electrically insulate any conductive areas on the backside support from directly coupling series interconnect vias on one solar cell to any series interconnect vias on any other solar cell. The electrically nonconductive areas may electrically insulate electrically insulate any conductive areas on the backside support from directly coupling series interconnect vias from EWT vias on the same solar cell. The EWT vias may define an opening passing through all layers of the solar cell. The series interconnect vias may define an opening passing through only a portion of the layers of the solar cell and does not define an opening passing through all layers of the solar cell. The series interconnect vias may define openings passing through a bottom electrode insulating layer without passing through the entire solar cell. The series interconnect vias define an opening passing through a bottom electrode insulating layer without passing completely through the bottom electrode. The conductive material in the EWT vias may electrically couple the electrically conductive area on the backside support to the transparent conductor without being in direct electrical contact with the bottom electrode. The conductive material in the series interconnect vias may electrically couple the electrically conductive area on the backside support to the bottom electrode, without directly contacting a portion of the electrically conductive area in contact with an EWT via or a series interconnect via on another solar cell.

For any of the embodiments described herein, the following may also apply. The backside support may be comprised of a layer of a conductive material and a layer of an insulating material. The backside support may be patterned to have gaps that create the nonconductive areas. The backside support may be patterned to have gaps filled with polymeric material or other insulating material that create the nonconductive areas. The backside support may include a plurality of openings for accessing the series interconnect vias to allow the vias to be filled with conductive material after the backside support is coupled to the solar cell. The openings may optionally be filled or otherwise sealed after conductive material has been delivered. An encapsulant layer may be coupled over the solar cells. A weatherproofing layer may be positioned over the solar cells. The photovoltaic layer may be comprised of at least two discrete layers forming a P-N junction, wherein at least one of the layers comprises of a CIS-based material. Filled vias may have a diameter of about 1 mm or less. The insulating layer may cover sidewalls of the vias and a portion of the transparent conductor around each of the vias, wherein the portion is within about 2 times the diameter of the via from the edge of the via.

In yet another embodiment the present invention, a method is provided comprising of forming a solar cell having at least one transparent conductor, an photovoltaic layer, and at least one bottom electrode; having at least one transparent conductor, a photovoltaic layer, at least one bottom electrode, a plurality of emitter wrap through (EWT) vias sized to contain a conductive material, and a plurality of series interconnect vias sized to contain a conductive material. The solar cell may be coupled to a backside support, wherein the backside support is patterned to have electrically conductive areas and electrically nonconductive areas that create a series interconnection between the solar cell and at least one other solar cell supported by the backside support and prevents parallel connections between the solar cells.

For any of the embodiments described herein, the following may also apply. The solar cell may have a high efficiency backside electrode configuration. The EWT vias may be filled with a conductive material. The EWT vias may be filled with a conductive material after the solar cell is coupled to the solar cell. The series interconnect vias may be filled with a conductive material. The series interconnect vias may be filled with a conductive material after the solar cell is coupled to the solar cell. A plurality of openings may be formed in the backside support to allow the vias to be filled after the solar cell is coupled to the backside support. The solar cell may be coupled to the backside support to create physical support and simultaneously create electrical connections between the solar cells. The electrically nonconductive areas may electrically insulate any conductive areas on the backside support from directly coupling series interconnect vias on one solar cell to any series interconnect vias on any other solar cell. The electrically nonconductive areas electrically may electrically insulate any conductive areas on the backside support from directly coupling series interconnect vias from EWT vias on the same solar cell. The EWT vias may define an opening passing through all layers of the solar cell. The series interconnect vias may define an opening passing through only a portion of the layers of the solar cell and does not define an opening passing through all layers of the solar cell. The series interconnect vias may define openings passing through a bottom electrode insulating layer without passing through the entire solar cell. The series interconnect vias may define an opening passing through a bottom electrode insulating layer without passing completely through the bottom electrode. Conductive material in the EWT vias may electrically couple the electrically conductive area on the backside support to the transparent conductor without being in direct electrical contact with the bottom electrode. Conductive material in the series interconnect vias may electrically couple the electrically conductive area on the backside support to the bottom electrode, without directly contacting a portion of the electrically conductive area in contact with an EWT via or a series interconnect via on another solar cell. The backside support may include a layer of a conductive material and a layer of an insulating material. The backside support may be patterned to have gaps that create the nonconductive areas. The backside support may be patterned to have gaps filled with polymeric material that create the nonconductive areas. The backside support may include a plurality of openings for accessing the series interconnect vias to allow the vias to be filled with conductive material after the backside support is coupled to the solar cell.

For any of the embodiments described herein, the following may also apply. An encapsulant layer may be coupled over the solar cells. A weatherproofing layer may be positioned over the solar cells. The photovoltaic layer may be comprised of at least two discrete layers forming a P-N junction, wherein at least one of the layers comprises of a CIS-based material. A source may be used that sprays insulating material from an underside of the solar cell to avoid substantially covering the transparent conductor with insulating material. An insulating material may be sprayed from an underside of the solar cell to minimize amount of material deposited on the transparent conductor without using a mask on the transparent conductor. A plurality of electrical conduction fingers may be formed on the transparent conductor in the solar cell. The backside support may be coupled to a roofing membrane and/or other building material. The solar cells may be placed without first coupling the solar cells together as a string of solar cells. A pick and place robot may be used to place individual solar cells onto the substrate support. The cells may be connected in series by deposition processes rather than by mechanical connections selected from the group consisting of: soldering and/or welding of wires or tabs between cells. The cells may be connected in series by solution deposition processes rather than by mechanical connections selected from the group consisting of: soldering and/or welding of wires or tabs between cells. The cells may be connected in series by printing processes rather than by mechanical connections selected from the group consisting of: soldering and/or welding of wires or tabs between cells. The cells may be connected in series by thin film process rather than by mechanical connections selected from the group consisting of: soldering and/or welding of wires or tabs between cells. The coupling step may be comprised of laminating the solar cell and backside support together. Optionally, the coupling step may be comprised of: a) laminating thin films of foil which have had vias punched in them in specific arrays; b) filling at least a portion of the vias with conductive printable material; and c) filling the vias with insulating printable material. Optionally the coupling step may be comprised of: laminating the solar cells to the backside support; filling at least a portion of the vias with conductive printable material; and filling the vias with insulating printable material. It should also be understood that the filling of vias on both sides may occur simultaneously, sequentially, curing one and then filling the other, simultaneously curing or any other combination.

A further understanding of the nature and advantages of the invention will become apparent by reference to the remaining portions of the specification and drawings.

BRIEF DESCRIPTION OF THE DRAWINGS

FIGS. 21 and 22 show photovoltaic devices placed onto supports according to embodiments of the present invention.

DETAILED DESCRIPTION OF THE EMBODIMENT

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials, reference to "a compound" may include multiple compounds, and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings:

"Optional" or "optionally" means that the subsequently described circumstance may or may not occur, so that the description includes instances where the circumstance occurs and instances where it does not. For example, if a device optionally contains a feature for a barrier film, this means that the barrier film feature may or may not be present, and, thus, the description includes both structures wherein a device possesses the barrier film feature and structures wherein the barrier film feature is not present.

Figure 1A:
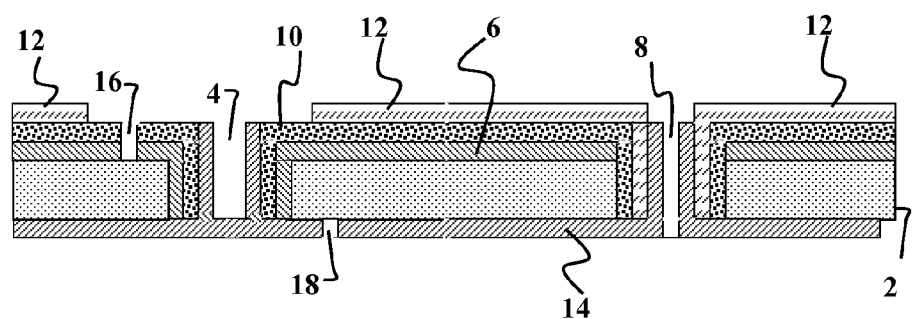
FIG. 1A is a cross-sectional schematic diagram of a portion of a solar cell array according to the prior art.

For example FIG. 1A illustrates a portion of a prior art solar cell array 1. The array 1 is manufactured on a flexible insulating substrate 2. Series interconnect holes 4 are formed through the substrate 2 and a bottom electrode layer 6 is deposited, e.g., by sputtering, on a front surface of the substrate and on sidewalls of the holes. Current collection holes 8 are then formed through the bottom electrode and substrate at selected locations and one or more semiconductor layers 10 are then deposited over the bottom electrode 6 and the sidewalls of the series interconnect holes 4 and current collection holes 8. A transparent conductor layer 12 is then deposited using a shadow mask that covers the series interconnect holes 4. A second metal layer 14 is then deposited over the backside of the substrate 2 making electrical contact with the transparent conductor layer 12 through the current collection holes and providing series interconnection between cells through the series interconnect holes. Laser scribing 16, 18 on the front side and the back side separates the monolithic device into individual cells.

Figure 1B:
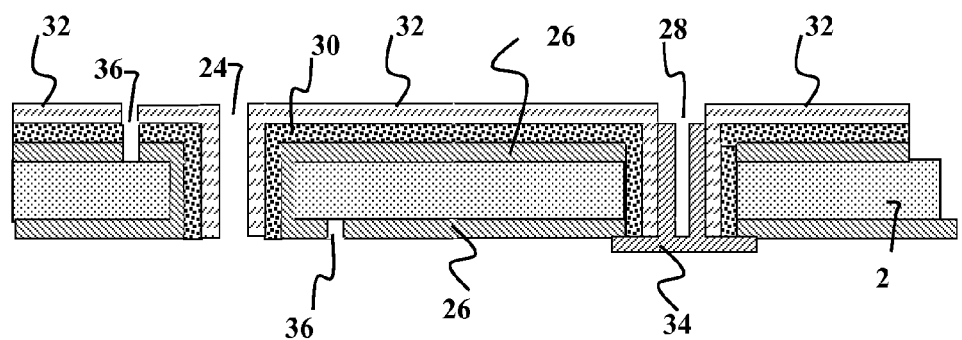
FIG. 1B is a cross-sectional schematic diagram of a portion of an alternative solar cell array according to the prior art.

FIG. 1B depicts another prior art array 20 that is a variation on the array 1. The array 20 is also manufactured on a flexible insulating substrate 22. Series interconnect holes 24 are formed through the substrate 22 and a bottom electrode layer 26 is deposited, e.g., by sputtering, on front and back surfaces of the substrate 22 and on sidewalls of the holes 24. Current collection holes 28 are then formed through the bottom electrode and substrate at selected locations and one or more semiconductor layers 30 and a transparent conducting layer 32 are then deposited over the bottom electrode 26 on the front side and on the sidewalls of the series interconnect holes 24 and current collection holes 28. A second metal layer 34 is then deposited over the backside of the substrate 22 using a shadow mask that covers everything except the current collection holes 28 making electrical contact with the transparent conductor layer 32. Laser scribing 36, 38 on the front side and the back side separates the monolithic device into individual cells.

Unfortunately, solar cell arrays based on the configurations shown in FIGS. 1A-1B have several drawbacks. First, the metal layers are deposited by sputtering, which is a vacuum technique. Vacuum techniques are relatively, slow, difficult and expensive to implement in large scale roll-to-roll manufacturing environments. Secondly, the manufacturing process produces a monolithic array and sorting of individual cells for yield is not possible. This means that only a few bad cells can ruin the array and therefore increase cost. Even if the cells were monolithically arrayed, the manufacturing process to create a module having serially interconnected cells creates its own set of challenges.

High Efficiency Cell Configuration

Figure 2A:
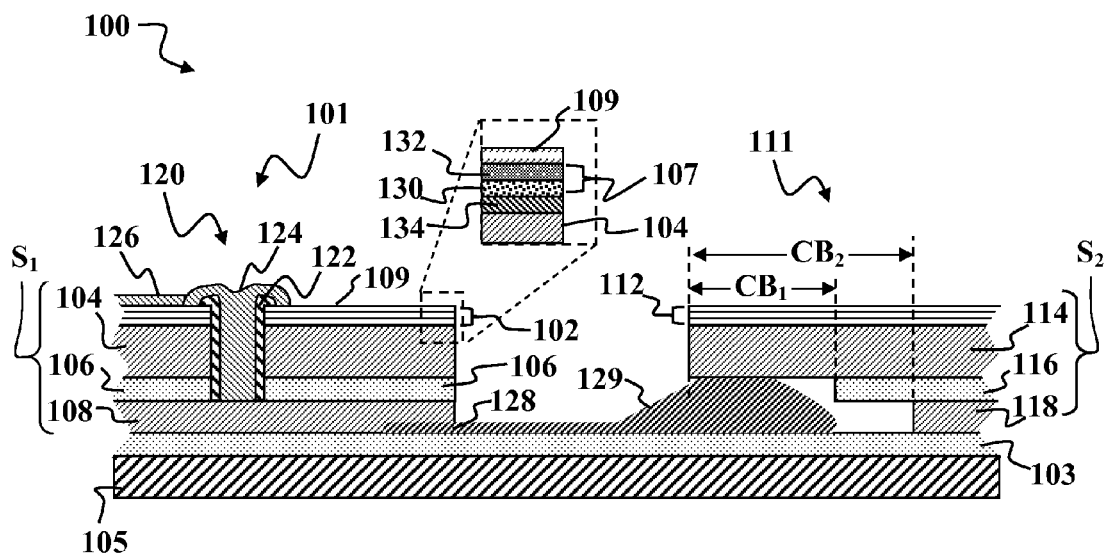
FIG. 2A is a vertical cross-sectional schematic diagram of a portion of an array of optoelectronic devices according to an embodiment of the present invention.
Figure 2B:
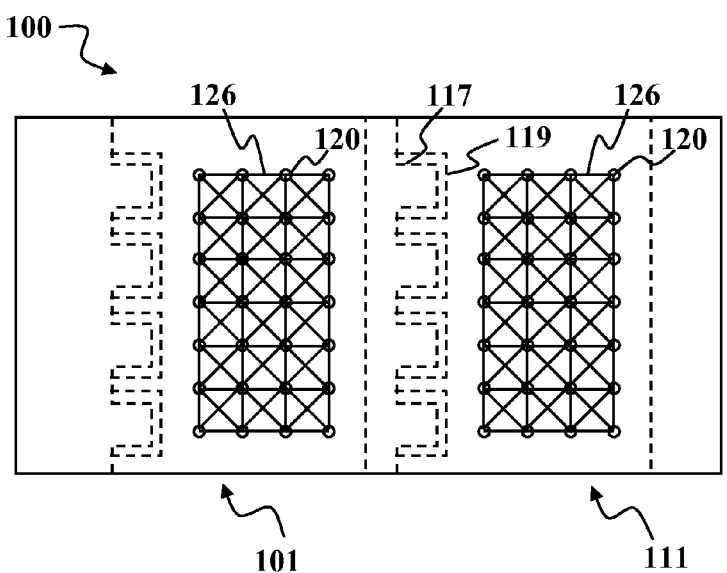
FIG. 2B is a plan view schematic diagram of the array of FIG. 1A.

FIGS. 2A-2B illustrates an array 100 of optoelectronic devices according to an embodiment of the present invention. In some embodiments, this may be considered a series interconnections in an array 100 of optoelectronic devices. The array 100 includes a first device module 101 and a second device module 111. The device modules 101, 111 may be photovoltaic devices, such as solar cells, or light-emitting devices, such as light-emitting diodes. In a preferred embodiment, the device modules 101, 111 are solar cells. The first and second device modules 101, 111 are attached to an insulating carrier substrate 103, which may be made of a plastic material such as polyethylene terephthalate (PET), e.g., about 50 microns thick. The carrier substrate 103 may, in turn, be attached to a thicker structural membrane 105, e.g., made of a polymeric roofing membrane material such as thermoplastic polyolefin (TPO) or ethylene propylene diene monomer (EPDM), to facilitate installing the array 100 on an outdoor location such as a roof.

The device modules 101, 111, which may be about 4 inches in length and 12 inches wide, may be cut from a much longer sheet containing several layers that are laminated together. Each device module 101, 111 generally includes a device layer 102, 112 in contact with a bottom electrode 104, 114 and an insulating layer 106, 116 between the bottom electrode 104, 114 and a conductive back plane 108, 118. It should be understood that in some embodiments of the present invention, the back plane 108, 118 may be described as a backside top electrode 108, 118. The bottom electrodes 104, 114, insulating layers 106, 116 and back planes 108, 118 for substrates $S_1$, $S_2$ support the device layers 102, 112

In contrast to prior art cells, where the substrates are formed by depositing thin metal layers on an insulating substrate, embodiments of the present invention utilize substrates $S_1$, $S_2$ based on flexible bulk conducting materials, such as foils. Although bulk materials such as foils are thicker than prior art vacuum deposited metal layers they can also be cheaper, more readily available and easier to work with. Preferably, at least the bottom electrode 104, 114 is made of a metal foil, such as aluminum foil. Alternatively, copper, stainless steel, titanium, molybdenum or other suitable metal foils may be used. By way of example, the bottom electrodes 104, 114 and back planes 108, 118 may be made of aluminum foil about 1 micron to about 200 microns thick, preferably about 25 microns to about 100 microns thick; the insulating layers 106, 116 may be made of a plastic foil material, such as polyethylene terephthalate (PET) about 1 micron to about 200 microns thick, preferably about 10 microns to about 50 microns thick. In one embodiment, among others, the bottom electrode 104, 114, insulating layer 106, 116 and back plane 108, 118 are laminated together to form the starting substrates S1, S2. Although foils may be used for both the bottom electrode 104, 114 and the back plane 108, 118 it is also possible to use a mesh grid on the back of the insulating layer 106, 116 as a back plane. Such a grid may be printed onto the back of the insulating layer 106, 116 using a conductive ink or paint. One example, among others, of a suitable conductive paint or ink is Dow Corning® PI-2000 Highly Conductive Silver Ink available from Dow Corning Corporation of Midland Mich. Dow Corning® is a registered trademark of Dow Corning Corporation of Midland Mich. Furthermore, the insulating layer 106, 116 may be formed by anodizing a surface of a foil used for the bottom electrode 104, 114 or back plane 108, 118 or both, or by applying an insulating coating by spraying, coating, or printing techniques known in the art.

The device layers 102, 112 generally include an active layer 107 disposed between a transparent conductive layer 109 and the bottom electrode 104. By way of example, the device layers 102, 112 may be about 2 microns thick. At least the first device 101 includes one or more electrical contacts 120 between the transparent conducting layer 109 and the back plane 108. The electrical contacts 120 are formed through the transparent conducting layer 109, the active layer 107, the bottom electrode 104 and the insulating layer 106, The electrical contacts 120 provide an electrically conductive path between the transparent conducting layer 109 and the back plane 108. The electrical contacts 120 are electrically isolated from the active layer 107, the bottom electrode 104 and the insulating layer 106.

The contacts 120 may each include a via formed through the active layer 107, the transparent conducting layer 109, the bottom electrode 104 and the insulating layer 106. Each via may be about 0.1 millimeters to about 1.5 millimeters, preferably 0.5 millimeters to about 1 millimeter in diameter. The vias may be formed by punching or by drilling, for example by mechanical, laser or electron beam drilling, or by a combination of these techniques. An insulating material 122 coats sidewalls of the via such that a channel is formed through the insulating material 122 to the back plane 108. The insulating material 122 may have a thickness between about 1 micron and about 200 microns, preferably between about 10 microns and about 200 microns.

The insulating material 122 should preferably be at least 10 microns thick to ensure complete coverage of the exposed conductive surfaces behind it. The insulating material 122 may be formed by a variety of printing techniques, including for example inkjet printing or dispensing through an annular nozzle. A plug 124 made of an electrically conductive material at least partially fills the channel and makes electrical contact between the transparent conducting layer 109 and the back plane 108. The electrically conductive material may similarly be printed. A suitable material and method, for example, is inkjet printing of solder (called "solderjet" by Microfab, Inc., Plano, Tex., which sells equipment useful for this purpose). Printing of conductive adhesive materials known in the art for electronics packaging may also be used, provided time is allowed subsequently for removal of solvent which may or may not be present, and curing. The plug 124 may have a diameter between about 5 microns and about 500 microns, preferably between about 25 and about 100 microns.

By way of nonlimiting example, in other embodiments, the device layers 102, 112 may be about 2 microns thick, the bottom electrodes 104, 114 may be made of aluminum foil about 100 microns thick; the insulating layers 106, 116 may be made of a plastic material, such as polyethylene terephthalate (PET) about 25 microns thick; and the backside top electrodes 108, 118 may be made of aluminum foil about 25 microns thick. The device layers 102, 112 may include an active layer 107 disposed between a transparent conductive layer 109 and the bottom electrode 104. In such an embodiment, at least the first device 101 includes one or more electrical contacts 120 between the transparent conducting layer 109 and the backside top electrode 108. The electrical contacts 120 are formed through the transparent conducting layer 109, the active layer 107, the bottom electrode 104 and the insulating layer 1060 The electrical contacts 120 provide an electrically conductive path between the transparent conducting layer 109 and the backside top electrode 108. The electrical contacts 120 are electrically isolated from the active layer 107, the bottom electrode 104 and the insulating layer 106.

The formation of good contacts between the conductive plug 124 and the substrate 108 may be assisted by the use of other interface-forming techniques such as ultrasonic welding. An example of a useful technique is the formation of gold stud-bumps, as described for example by J. Jay Wimer in "3-D Chip Scale with Lead-Free Processes" in Semiconductor International, Oct. 1, 2003, which is incorporated herein by reference. Ordinary solders or conductive inks or adhesives may be printed on top of the stud bump.

In forming the vias, it is important to avoid making shorting connections between the top electrode 109 and the bottom electrode 104. Therefore, mechanical cutting techniques such as drilling or punching may be advantageously supplemented by laser ablative removal of a small volume of material near the lip of the via, a few microns deep and a few microns wide. Alternatively, a chemical etching process may be used to remove the transparent conductor over a diameter slightly greater than the via. The etching can be localized, e.g., by printing drops of etchant in the appropriate places using inkjet printing or stencil printing.

A further method for avoiding shorts involves deposition of a thin layer of insulating material on top of the active layer 107 prior to deposition of the transparent conducting layer 109. This insulating layer is preferably several microns thick, and may be in the range of 1 to 100 microns. Since it is deposited only over the area where a via is to be formed (and slightly beyond the borders of the via), its presence does not interfere with the operation of the optoelectronic device. In some embodiments of the present invention, the layer may be similar to structures described in U.S. patent application Ser. No. 10/810,072 to Karl Pichler, filed Mar. 25, 2004, which is hereby incorporated by reference. When a hole is drilled or punched through this structure, there is a layer of insulator between the transparent conducting layer 109 and the bottom electrode 104 which may be relatively thick compared to these layers and to the precision of mechanical cutting processes, so that no short can occur.

The material for this layer can be any convenient insulator, preferably one that can be digitally (e.g. inkjet) printed. Thermoplastic polymers such as Nylon PA6 (melting point (m.p.) 223° C.), acetal (m.p. 165° C.), PBT (structurally similar to PET but with a butyl group replacing the ethyl group) (m.p. 217° C.), and polypropylene (m.p. 165° C.), are examples which by no means exhaust the list of useful materials. These materials may also be used for the insulating layer 122. While inkjet printing is a desirable way to form the insulator islands, other methods of printing or deposition (including conventional photolithography) are also within the scope of the invention.

In forming the vias, it is useful to fabricate the optoelectronic device in at least two initially separate elements, with one comprised of the insulating layer 106, the bottom electrode 104 and the layers 102 above it, and the second comprised of the back plane 108. These two elements are then laminated together after the vias have been formed through the composite structure 106/104/102, but before the vias are filled. After this lamination and via formation, the back plane 108 is laminated to the composite, and the vias are filled as described above.

Although jet-printed solders or conductive adhesives comprise useful materials for forming the conductive via plug 124, it is also possible to form this plug by mechanical means. Thus, for example, a wire of suitable diameter may be placed in the via, forced into contact with the back plane 108, and cut off at the desired height to form the plug 124, in a manner analogous to the formation of gold stud bumps. Alternatively a pre-formed pin of this size can be placed into the hole by a robotic arm. Such pins or wires can be held in place, and their electrical connection to the substrate assisted or assured, by the printing of a very thin layer of conductive adhesive prior to placement of the pin. In this way the problem of long drying time for a thick plug of conductive adhesive is eliminated. The pin can have tips or serrations on it which punch slightly into the back plane 108, further assisting contact. Such pins may be provided with insulation already present, as in the case of insulated wire or coated wire (e.g. by vapor deposition or oxidation). They can be placed in the via before the application of the insulating material, making it easier to introduce this material.

If the pin is made of a suitably hard metal, and has a slightly tapered tip, it may be used to form the via during the punching step. Instead of using a punch or drill, the pin is inserted into the composite 106/104/102, to a depth such that the tip just penetrates the bottom; then when the substrate 108 is laminated to this composite, the tip penetrates slightly into it and forms a good contact. These pins may be injected into the unpunched substrate by, for example, mechanical pressure or air pressure directed through a tube into which the pin just fits.

Figure 2C:
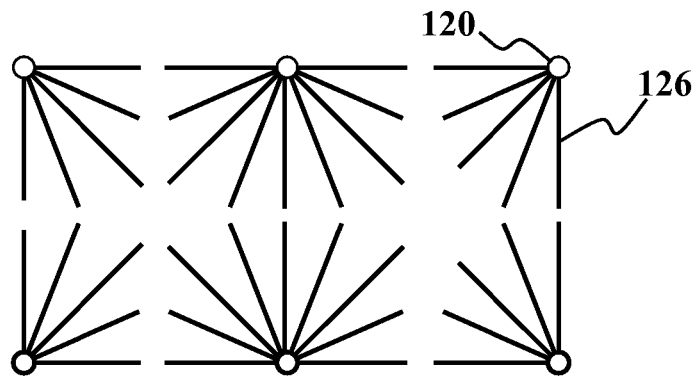
FIGS. 2C-2E are plan view schematic diagrams illustrating alternative trace patterns for an optoelectronic device of the type shown in FIGS. 2A-2B.
Figure 2D:
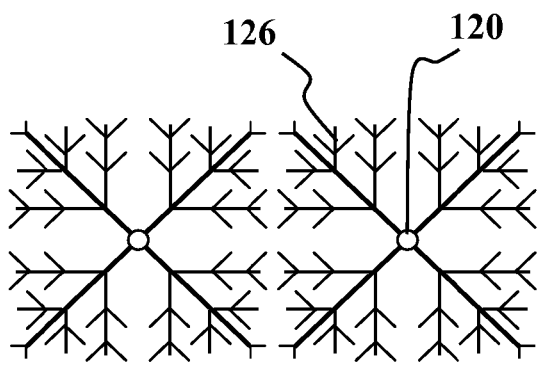
Figure 2E:
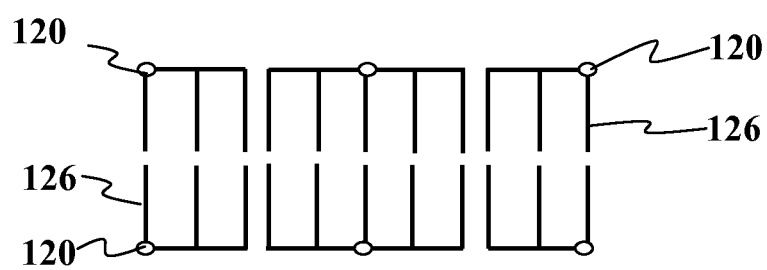

One or more conductive traces 126, e.g., made of Al, Ni, or Ag, may be disposed on the transparent conducting layer 109 in electrical contact with the electrically conductive material 124. As shown in FIG. 2B, the traces 126 may interconnect multiple contacts 120 to reduce the overall sheet resistance. By way of example, the contacts 120 may be spaced about 1 centimeter apart from one another with the traces 126 connecting each contact with its nearest neighbor or in some cases to the transparent conductor surrounding it. Preferably, the number, width and spacing of the traces 126 is chosen such that the contacts 120 and traces 126 cover less than about 1% of the surface of the device module 101. The traces 126 may have a width between about 1 micron and about 200 microns, preferably between about 5 microns and about 50 microns. The traces 126 may be separated by center-to-center distances between about 0.1 millimeter and about 10 millimeters, preferably between about 0.5 millimeter and about 2 millimeters. Wider lines require a larger separation in order to avoid excessive shadowing loss. A variety of patterns or orientations for the traces 126 may be used so long as the lines are approximately equidistant from each other (e.g., to within a factor of two). An alternative pattern in which the traces 126 fan out from the contacts 120 is depicted in FIG. 2C. In another alternative pattern, shown in FIG. 2D, the traces 126 form a "watershed" pattern, in which thinner traces 126 branch out from thicker traces that radiate from the contacts 120. In yet another alternative pattern, shown in FIG. 2E, the traces 126 form a rectangular pattern from the contacts 120. It should be understood that in some embodiments of the present invention, the vertical lines may be thinner than the horizontal lines. The number of traces 126 connected to each contact may be more or less than the number shown in FIG. 2E. Some embodiments may have one more, two more, three more, or the like. The trace patterns depicted in the examples shown in FIG. 2B, FIG. 2C, FIG. 2D, and FIG. 2E are for the purpose of illustration and do not limit the possible trace patterns that may be used in embodiments of the present invention. Note that since the conductive back planes 108, 118 carry electrical current from one device module to the next the conductive traces 126 can include "fingers" while avoiding thick "busses". This reduces the amount of shadowing due to the busses and also provides a more aesthetically pleasing appearance to the device array 100.

Fabricating the device modules 101, 111 on substrates S1, S2 made of relatively thick, highly conductive, flexible bulk conductor bottom electrodes 104, 114 and backplanes 108, 118 and forming insulated electrical contracts 120 through the transparent conducting layer 109, the active layer 130, the bottom electrodes 104, 114 and the insulating layer 106, 116 allows the device modules 101, 111 to be relatively large. Consequently the array 100 can be made of fewer device modules requiring fewer series interconnections compared to prior art arrays. For example, the device modules 101, 111 may be between about 1 centimeter and about 30 centimeters long and between about 1 and about 30 centimeters wide. Smaller cells (e.g., less than 1 centimeter long and/or 1 centimeter wide) may also be made as desired.

Note that since the back planes 108, 118 carry electric current from one device module to the next, the pattern of traces 126 need not contain thick busses, as used in the prior art for this purpose. Instead, the pattern of traces 126 need only provide sufficiently conductive "fingers" to carry current to the contacts 120. In the absence of busses, a greater portion of the active layers 102, 112 is exposed, which enhances efficiency. In addition, a pattern of traces 126 without busses can be more aesthetically pleasing.

Electrical contact between the back plane 108 of the first device module 101 and the bottom electrode 114 of the second device module 111 may be implemented by cutting back the back plane 118 and insulating layer 116 of the second device module to expose a portion of the bottom electrode 114. FIG. 2B illustrates an example of one way, among others, for cutting back the back plane 118 and insulating layer 116. Specifically, notches 117 may be formed in an edge of the insulating layer 116. The notches 117 align with similar, but slightly larger notches 119 in the back plane 118. The alignment of the notches 117, 119 exposes portions of the bottom electrode 114 of the second device module 111.

Electrical contact may be made between the back plane 108 of the first device module 101 and the exposed portion of the bottom electrode 114 of the second device module 111 in a number of different ways. For example, as shown in FIG. 2A, thin conducting layer 128 may be disposed over a portion of the carrier substrate 103 in a pattern that aligns with the notches 117, 119.

The thin conducting layer may be, e.g., a conductive (filled) polymer or silver ink. The conducting layer can be extremely thin, e.g., about 1 micron thick. A general criteria for determining the minimum thickness of the thin conducting layer 128 is that the fractional power $p=(J/V)\rho(L_o^2/d)$ dissipated in this layer is about $10^{-4}$ or less, where J is the current density, V is the voltage, Lois the length of the thin conductive layer 128 (roughly the width of the gap between the first and second device modules) and p and d are respectively the resistivity and the thickness of the thin conductive layer 128. In that case the loss of power from this source is far less than 1% of the power being generated, and is negligible. By way of numerical example, for many applications (J/V) is roughly 0.06 A/V cm². If $L_o$=400 microns=0.04 cm then ρ is approximately equal to $10^{-4}$ ρ/d). Thus, even if the resistivity ρ is about $10^{-5}$ Ωcm (which is about ten times less than for a good bulk conductor), the criterion can be satisfied with d less than about 1 micron ($10^{-4}$ cm) thick. Thus, even a relatively resistive polymer conductor of almost any plausible printable thickness will work.

The first device module 101 may be attached to the carrier substrate 103 such that the back plane 108 makes electrical contact with the thin conducting layer 128 while leaving a portion of the thin conducting layer 128 exposed. Electrical contact may then be made between the exposed portion of the thin conducting layer 128 and the exposed portion of the bottom electrode 114 of the second device module 111. For example, a bump of conductive material 129 (e.g., more conductive adhesive) may be placed on the thin conducting layer 128 at a location aligned with the exposed portion of the bottom electrode 114. The bump of conductive material 129 is sufficiently tall as to make contact with the exposed portion of the bottom electrode 114 when the second device module 111 is attached to the carrier substrate. The dimensions of the notches 117, 119 may be chosen so that there is essentially no possibility that the thin conducting layer 128 will make undesired contact with the back plane 118 of the second device module 111. For example, the edge of the bottom electrode 114 may be cut back with respect to the insulating layer 116 by an amount of cutback CB1 of about 400 microns. The back plane 118 may be cut back with respect to the insulating layer 116 by an amount CB2 that is significantly larger than CB1.

The device layers 102, 112 are preferably of a type that can be manufactured on a large scale, e.g., in a roll-to-roll processing system. There are a large number of different types of device architectures that may be used in the device layers 102, 112. By way of example, and without loss of generality, the inset in FIG. 2A shows the structure of a CIGS active layer 107 and associated layers in the device layer 102. By way of example, the active layer 107 may include an absorber layer 130 based on materials containing elements of groups IB, IIIA and VIA. Preferably, the absorber layer 130 includes copper (Cu) as the group IB, Gallium (Ga) and/or Indium (In) and/or Aluminum as group IIIA elements and Selenium (Se) and/or Sulfur (S) as group VIA elements. Examples of such materials (sometimes referred to as CIGS materials) are described in U.S. Pat. No. 6,268,014, issued to Eberspacher et al on Jul. 31, 2001, and US Patent Application Publication No. US 2004-0219730 AI to Bulent Basol, published Nov. 4, 2004, both of which are incorporated herein by reference. A window layer 132 is typically used as a junction partner between the absorber layer 130 and the transparent conducting layer 109. By way of example, the window layer 132 may include cadmium sulfide (CdS), zinc sulfide (ZnS), or zinc selenide (ZnSe) or some combination of two or more of these. Layers of these materials may be deposited, e.g., by chemical bath deposition or chemical surface deposition, to a thickness of about 50 nm to about 100 nm. A contact layer 134 of a metal different from the bottom electrode may be disposed between the bottom electrode 104 and the absorber layer 130 to inhibit diffusion of metal from the bottom electrode 104. For example, if the bottom electrode 104 is made of aluminum, the contact layer 134 may be a layer of molybdenum.

Although CIGS solar cells are described for the purposes of example, those of skill in the art will recognize that embodiments of the series interconnection technique can be applied to almost any type of solar cell architecture. Examples of such solar cells include, but are not limited to: cells based on amorphous silicon, Graetzel cell architecture (in which an optically transparent film comprised of titanium dioxide particles a few nanometers in size is coated with a monolayer of charge transfer dye to sensitize the film for light harvesting), a nanostructured layer having an inorganic porous semiconductor template with pores filled by an organic semiconductor material (see e.g., US Patent Application Publication US 2005-0121068 AI, which is incorporated herein by reference), a polymer/blend cell architecture, organic dyes, and/or $C_{60}$ molecules, and/or other small molecules, micro-crystalline silicon cell architecture, randomly placed nanorods and/or tetrapods of inorganic materials dispersed in an organic matrix, quantum dot-based cells, or combinations of the above. Furthermore, embodiments of the series interconnection technique described herein can be used with optoelectronic devices other than solar cells.

Alternatively, the optoelectronic devices 101, 111 may be light emitting devices, such as organic light emitting diodes (OLEDs). Examples of OLEDs include light-emitting polymer (LEP) based devices. In such a case, the active layer 107 may include a layer of poly (3,4) ethylendioxythiophene: polystyrene sulfonate (PEDOT:PSS), which may be deposited to a thickness of typically between 50 and 200 nm on the bottom electrodes 104, 114, e.g., by web coating or the like, and baked to remove water. PEDOT:PSS is available from Bayer Corporation of Leverkusen, Germany. A polyfluorene based LEP may then be deposited on the PEDOT:PSS layer (e.g., by web coating) to a thickness of about 60-70 nm. Suitable polyfluorene-based LEPs are available from Dow Chemicals Company.

The transparent conductive layer 109 may be, e.g., a transparent conductive oxide (TCO) such as zinc oxide (ZnO) or aluminum doped zinc oxide (ZnO:Al), which can be deposited using any of a variety of means including but not limited to sputtering, evaporation, CBD, electroplating, CVD, PVD, ALD, and the like. Alternatively, the transparent conductive layer 109 may include a transparent conductive polymeric layer, e.g. a transparent layer of doped PEDOT (Poly-3,4-Ethylenedioxythiophene), which can be deposited using spin, dip, or spray coating, and the like. PSS:PEDOT is a doped, conducting polymer based on a heterocyclic thiophene ring bridged by a diether. A water dispersion of PEDOT doped with poly(styrenesulfonate) (PSS) is available from H.C. Starck of Newton, Massachussetts under the trade name of Baytron® P. Baytron® is a registered trademark of Bayer Aktiengesellschaft (hereinafter Bayer) of Leverkusen, Germany. In addition to its conductive properties, PSS:PEDOT can be used as a planarizing layer, which can improve device performance. A potential disadvantage in the use of PEDOT is the acidic character of typical coatings, which may serve as a source through which the PEDOT may chemically attack, react with, or otherwise degrade the other materials in the solar cell. Removal of acidic components in PEDOT may be carried out by anion exchange procedures. Non-acidic PEDOT can be purchased commercially. Alternatively, similar materials can be purchased from TDA materials of Wheat Ridge, Colo., e.g. Oligotron™ and Aedotron™

The gap between the first device module 101 and the second device module 111 may be filled with a curable polymer, e.g epoxy or silicone. An optional encapsulant layer (not shown) may cover the array 100 to provide environmental resistance, e.g., protection against exposure to water or air. The encapsulant may also absorb UV-light to protect the underlying layers. Examples of suitable encapsulant materials include one or more layers of fluoropolymers such as THV (e.g. Dyneon's THV220 fluorinated terpolymer, a fluorothermoplastic polymer of tetrafluoroethylene, hexafluoropropylene and vinylidene fluoride), Tefzel® (DuPont), Tefdel, ethylene vinyl acetate (EVA), thermoplastics, polyimides, polyamides, nanolaminate composites of plastics and glasses (e.g. barrier films such as those described in commonly-assigned, co-pending U.S. Patent Application Publication US 2005-0095422 A1, to Brian Sager and Martin Roscheisen, entitled "INORGANIC/ORGANIC HYBRID NANOLAMINATE BARRIER FILM" which is incorporated herein by reference), and combinations of the above.

Figure 3:
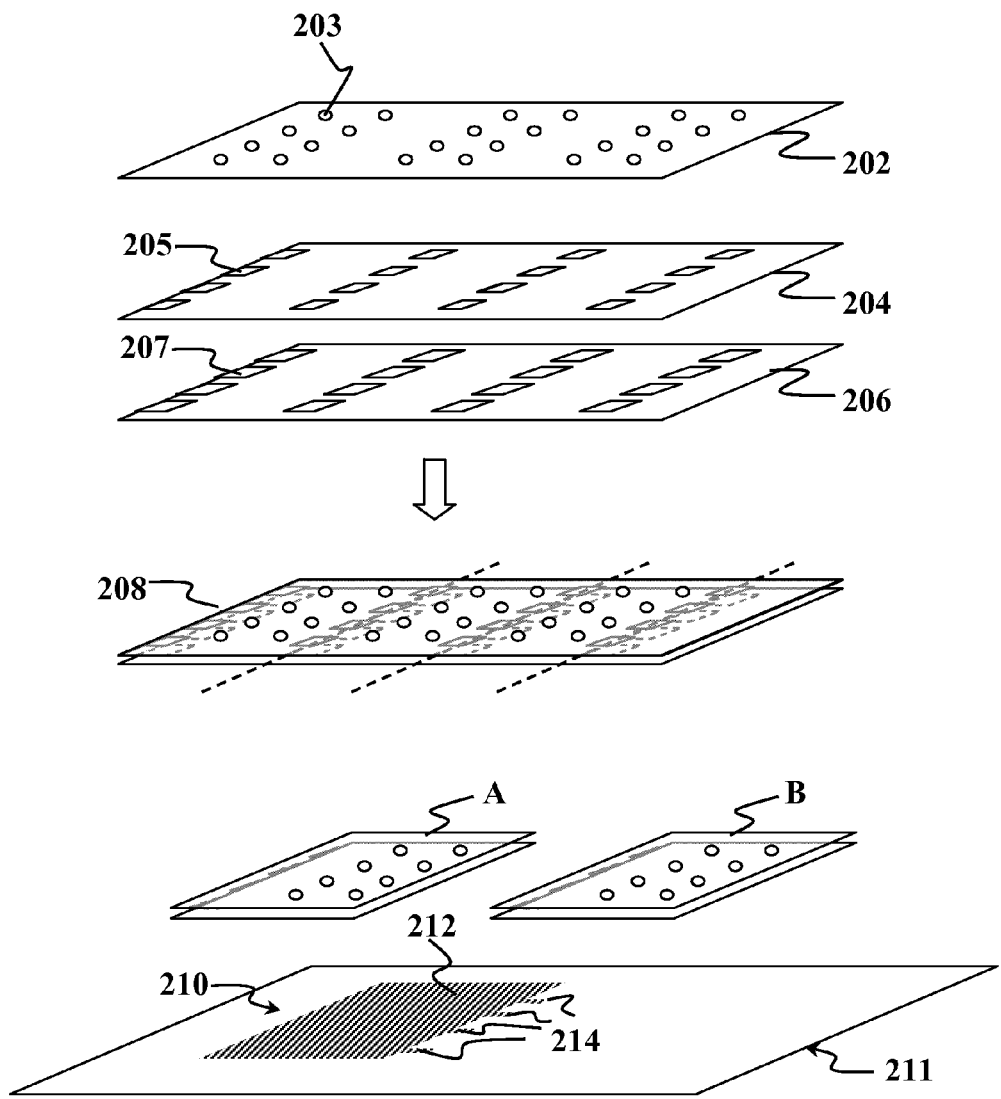
FIG. 3 is a sequence of schematic diagrams illustrating fabrication of an array of optoelectronic devices according to an embodiment of the present invention.

There are a number of different methods of fabricating interconnected devices according to embodiments of the present invention. For example, FIG. 3 illustrates one such method. In this method the devices are fabricated on a continuous device sheet 202 that includes an active layer between a bottom electrode and a transparent conductive layer, e.g., as described above with respect to FIGS. 2A-2B. The device sheet 202 is also patterned with contacts 203 like the contact 120 depicted in FIG. 2A. The contacts 203 may be electrically connected by conductive traces (not shown) as described above. An insulating layer 204 and a back plane 206 are also fabricated as continuous sheets. In the example shown in FIG. 3, the insulating layer 204 has been cut back, e.g., to form notches 205 that align with similar notches 207 in the back plane layer 206. The notches in the back plane layer 206 are larger than the notches in the insulating layer 204. The device sheet 202, insulating layer 204 and back plane layer are laminated together to form a laminate 208 having the insulating layer 204 between the device sheet 202 and the back plane 206. The laminate 208 is then cut into two or more device modules A, B along the dashed lines that intersect the notches 205, 207. A pattern of conductive adhesive 210 (e.g., a conductive polymer or silver ink) is then disposed on a carrier substrate 211. The modules are adhered to the carrier substrate 211. A larger area 212 of the conductive adhesive 210 makes electrical contact with the backplane 206 of module A. Fingers 214 of conductive adhesive 210 project out from the larger area 212. The fingers 214 align with the notches 205, 207 of module B. Extra conductive adhesive may be placed on the fingers 214 to facilitate electrical contact with the bottom electrode of module B through the notches 205, 207. Preferably, the fingers 214 are narrower than the notches 207 in the back plane 206 so that the conductive adhesive 210 does not make undesired electrical contact with the back plane 206 of module B.

Figure 4:
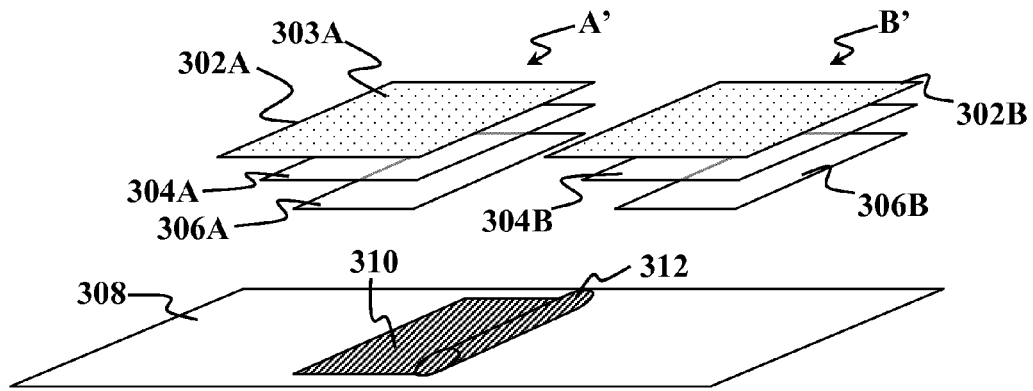
FIG. 4 is an exploded view schematic diagram illustrating fabrication of an array of optoelectronic devices according to an alternative embodiment of the present invention.

In the embodiment depicted in FIG. 3, the device sheet, insulating layer and back plane were laminated together before being cut into individual modules. In alternative embodiments, the layers may be cut first and then assembled into modules (e.g., by lamination). For example, as shown in FIG. 4, first and second device modules A', B' may be respectively laminated from pre-cut device layers 302A, 302B, insulating layers 304A, 304B, and back planes 306A, 306B. Each device layer 302A, 302B includes an active layer between a transparent conducting layer and a bottom electrode. At least one device layer 302A includes electrical contacts 303A (and optional conductive traces) of the type described above.

In this example, the back plane layer 306B of module B has been cut back by simply making it shorter than the insulating layer 304B so that the insulating layer 304B overhangs an edge of the back plane layer 306B. Similarly, the insulating layer 304B has been cut back by making it shorter than the device layer 302B or, more specifically, shorter than the bottom electrode of device layer 302B. After the pre-cut layers have been laminated together to form the modules A', B' the modules are attached to a carrier substrate 308 and electrical connection is made between the back plane 306A of module A' and the bottom electrode of the device layer 302B of module B'. In the example shown in FIG. 4, the connection is made through a conductive adhesive 310 with a raised portion 312, which makes contact with the bottom electrode while avoiding undesired contact with the back plane 306B of module B'.

Figure 5A:
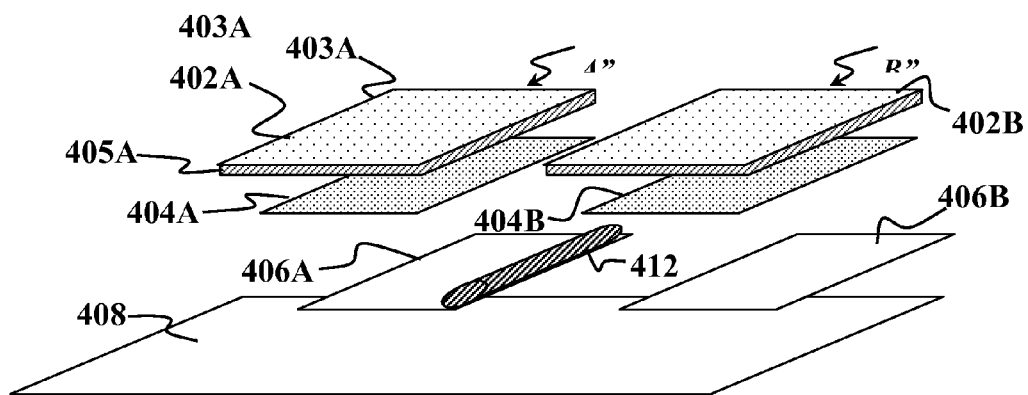
FIG. 5A is an exploded view schematic diagram illustrating fabrication of an array of optoelectronic devices according to another alternative embodiment of the present invention.
Figure 5B:
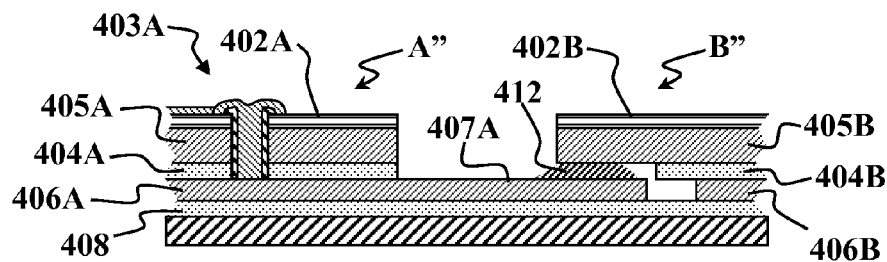
FIG. 5B is a cross-sectional schematic diagram illustrating a portion of the array of FIG. 5A.

FIGS. 5A-5B depict a variation on the method depicted in FIG. 4 that reduces the use of conductive adhesive. First and second device modules A", B" are assembled from pre-cut device layers 402A, 402B, insulating layers 404A, 404B and back plane layers 406A, 406B and attached to a carrier substrate 408. Insulated electrical contacts 403A make electrical contact through the device layers 402A, a bottom electrode 405A and the insulating layer 406A as shown in FIG. 5B. Front edges of the insulating layer 404B and back plane 406B of module B" are cut back with respect to the device layer 402B as described above with respect to FIG. 4. To facilitate electrical contact, however, a back edge of the back plane 406A of module A" extends beyond the back edges of the device layer 402A and insulating layer 404A. As a result, the device layer 402B of module B" overlaps the back plane 406A of module A". A ridge of conductive adhesive 412 on an exposed portion 407A of the back plane 406A makes electrical contact with an exposed portion of a bottom electrode 405B of the device layer 402B as shown in FIG. 5B.

In preferred embodiments of the methods described above, individual modules may be fabricated, e.g., as described above, and then sorted for yield. For example, two or more device modules may be tested for one or more performance characteristics such as optoelectronic efficiency, open circuit voltage, short circuit current, fill factor, etc. Device modules that meet or exceed acceptance criteria for the performance characteristics may be used in an array, while those that fail to meet acceptance criteria may be discarded. Examples of acceptance criteria include threshold values or acceptable ranges for optoelectronic efficiency or open circuit voltage. By sorting the device modules individually and forming them into arrays, higher yields may be obtained than by fabricating arrays of devices monolithically.

Figure 6A:
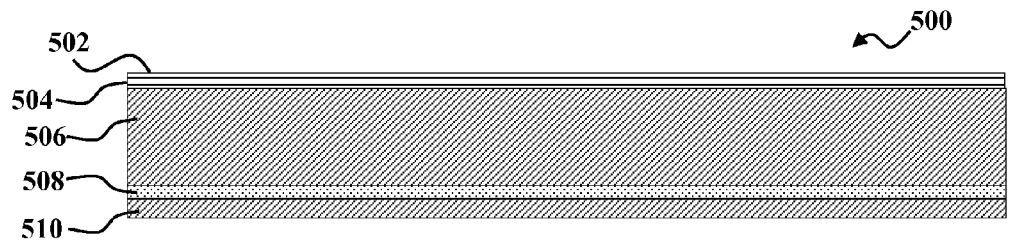
FIGS. 6A-6I are cross-sectional schematic diagrams illustrating formation of electrical contacts according to embodiments of the present invention.

In the discussion of the electrical contacts 120 between the transparent conductive layer and the back plane, vias were formed, coated with an insulating material and filled with a conductive material. In an alternative embodiment, connection between the transparent conductive layer and the back plane may be effected using a portion of the bottom electrode as part of the electrical contact. FIGS. 6A-6H illustrate examples of how this may be implemented. Specifically, one may start with a structure 500 (as shown in FIG. 6A) with a transparent conducting layer 502 (e.g., Al:ZnO, i:ZnO), an active layer 504 (e.g., CIGS), a bottom electrode 506 (e.g., 100 um Al), an insulating layer 508 (e.g., 50 um PET), and a back plane 510 (e.g., 25 um Al). Preferably, the back plane 510 is in the form of a thin aluminum tape that is laminated to the bottom electrode 506 using an insulating adhesive as the insulating layer 508. This can greatly simplify manufacture and reduce materials costs.

Figure 6B:
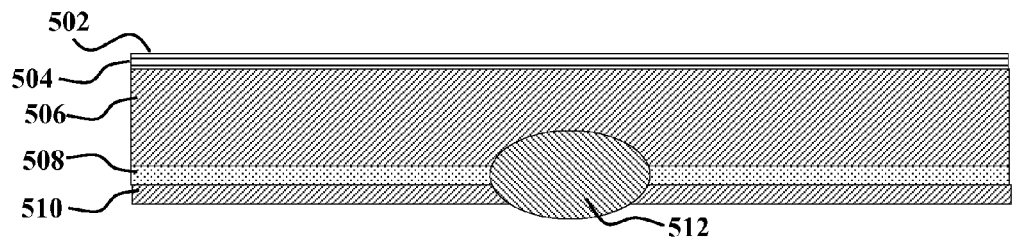

Electrical connection 512 may be made between the bottom electrode 506 and the back plane at one or more locations as shown in FIG. 6B. For example, a spot weld may be formed through insulating layer 508, e.g., using laser welding. Such a process is attractive by virtue of making the electrical connection in a single step. Alternatively, the electrical connection 512 may be formed through a process of drilling a blind hole through the back plane 510 and the insulating layer 508 to the bottom electrode and filling the blind hole with an electrically conductive material such as a solder or conductive adhesive.

Figure 6C:
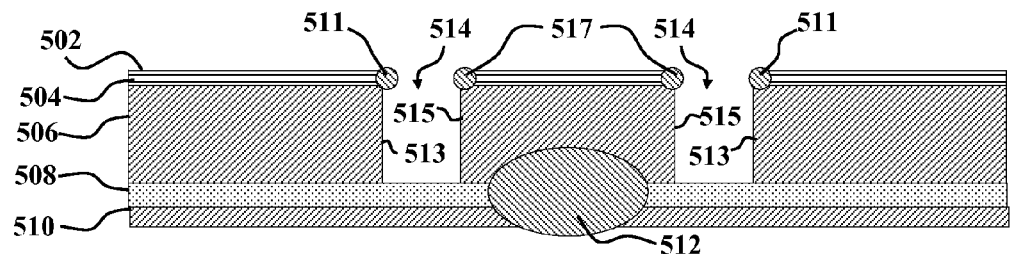

As shown in FIG. 6C, a trench 514 is then formed in a closed loop (e.g., a circle) around the electrical connection 512. The closed-loop trench 514 cuts through the transparent conducting layer 502, active layer 504, and bottom electrode 506, to the back plane 510. The trench 514 isolates a portion of the bottom electrode 506, active layer 504, and transparent conductive layer 502 from the rest of the structure 500. Techniques such as laser machining may be used to form the trench 514. If laser welding forms the electrical connection 512 with one laser beam and a second laser beam forms the trench 514, the two laser beams may be pre-aligned with respect to each other from opposite sides of the structure 500. With the two lasers pre-aligned, the electrical connection 512 and trench 514 may be formed in a single step, thereby enhancing the overall processing speed.

Figure 6D:
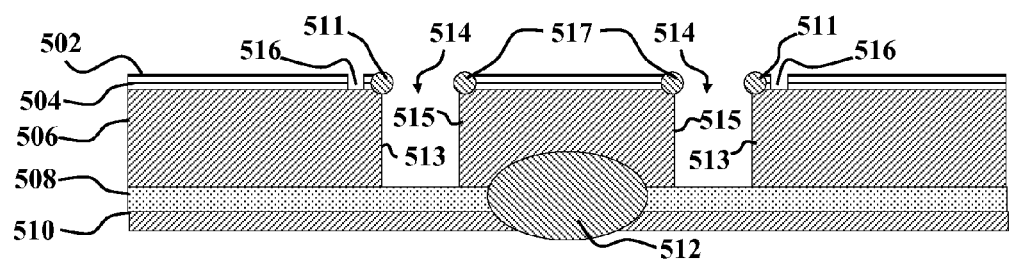

The process of forming the isolation trench may cause electrical short-circuits 511, 517 between the transparent conductive layer 502 and the bottom electrode 506. To electrically isolate undesirable short circuits 511 formed on an outside wall 513 of the trench 514 an isolation trench 516 is formed through the transparent conductive layer and the active layer to the bottom electrode 506 as shown in FIG. 6D. The isolation trench 516 surrounds the closed-loop trench 514 and electrically isolates the short circuits 511 on the outside wall 513 of the trench from the rest of the structure 500. A laser scribing process may form the isolation trench 516. A lesser thickness of material being scribed reduces the likelihood of undesired short circuits resulting from formation of the isolation trench 516.

Figure 6E:
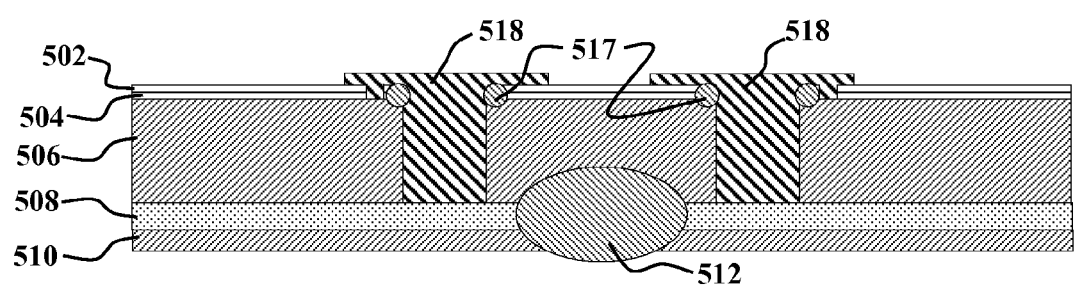
Figure 6F:
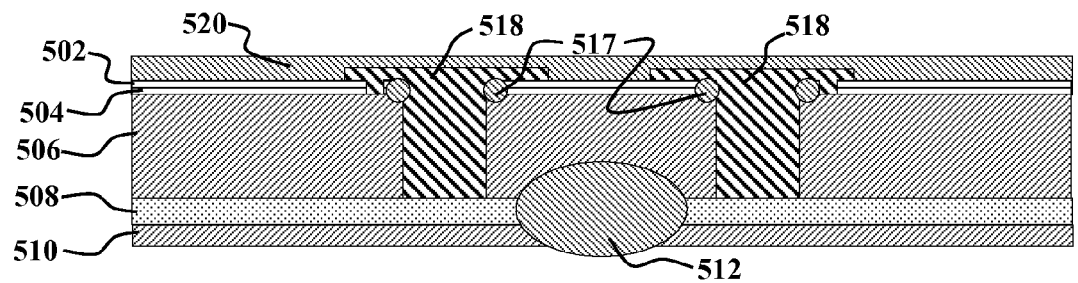

Not all short circuits between the transparent conducting layer 502 and the bottom electrode 506 are undesirable. Electrical shorts 517 along an inside wall 515 of the trench 514 can provide part of a desired electrical path to the electrical connection 512. If a sufficient amount of desirable short circuiting is present, the electrical contact may be completed as depicted in FIG. 6E-6F. First an insulating material 518 is deposited into the closed-loop trench 514 and isolation trench 516 e.g., in a "donut" pattern with a hole in the middle as shown in FIG. 6E. Next electrically conductive fingers 520 are deposited over portions of the structure 500 including the isolated portion surrounded by the trench 514 and non-isolated portions as depicted in FIG. 6F. The insulating material 518 may be deposited in a way that provides a sufficiently planar surface suitable for forming the conductive fingers

520. Electrical contact is then made between the transparent conducting layer 502 in the non-isolated portions outside the trench 514 and the back plane 510 through the fingers 520, the transparent conducting layer within the isolated portion, electrical shorts 517 on the inside wall of the trench 514, the portion of the bottom electrode 506 inside the trench 514 and the electrical connection 512.

Figure 6G:
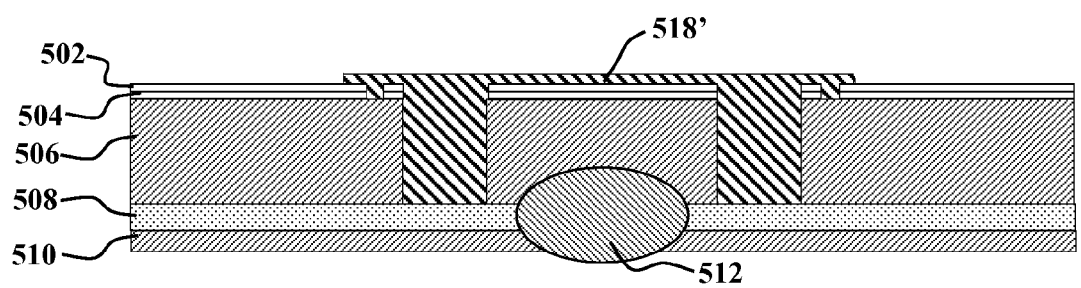
Figure 6H:
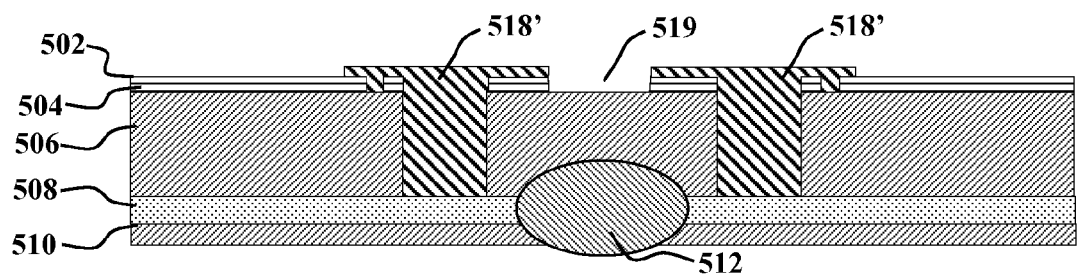
Figure 6I:
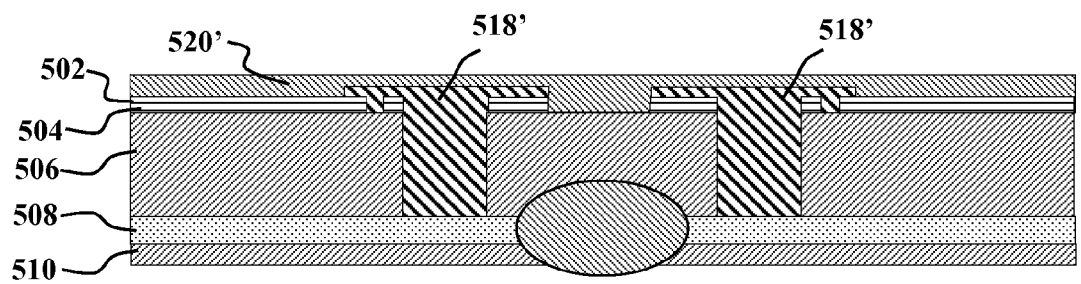

Alternatively, if the shorts 517 do not provide sufficient electrical contact, a process of drilling and filling may provide electrical contact between the fingers 520 and the isolated portion of the bottom electrode 506. In an alternative embodiment depicted in FIGS. 6G-6I, it is possible that insulating material 518' covers the isolated portion when it is deposited as shown in FIG. 6G. The insulating material 518' covering the isolated portion may be removed, e.g., by laser machining or mechanical processes such as drilling or punching, along with corresponding portions of the transparent conductive layer 502 and the active layer 504 to expose the bottom electrode 506 through an opening 519 as shown in FIG. 6H. Electrically conductive material 520' forms conductive fingers, as described above. The electrically conductive material makes contact with the exposed bottom electrode 506 through the opening 519 and completes the desired electrical contact as shown in FIG. 6I.

Note that there are several variations on the techniques described above with respect to FIGS. 6A-6I. For example, in some embodiments it may be desirable to make the electrical connection 512 after the closed-loop trench has been formed and filled with insulating material. There are several advantages of the above-described process for forming the electrical contact. The process steps are simplified. It is easier to deposit the insulating layer without worrying about covering up the back plane. The process allows for a planar surface for depositing the fingers 520, 520'. Reliable electrical contact can be made between the bottom electrode 506 and the back plane 510 through laser welding. Furthermore, electrical shorts can be isolated without jeopardizing a 100% yield.

Figure 7:
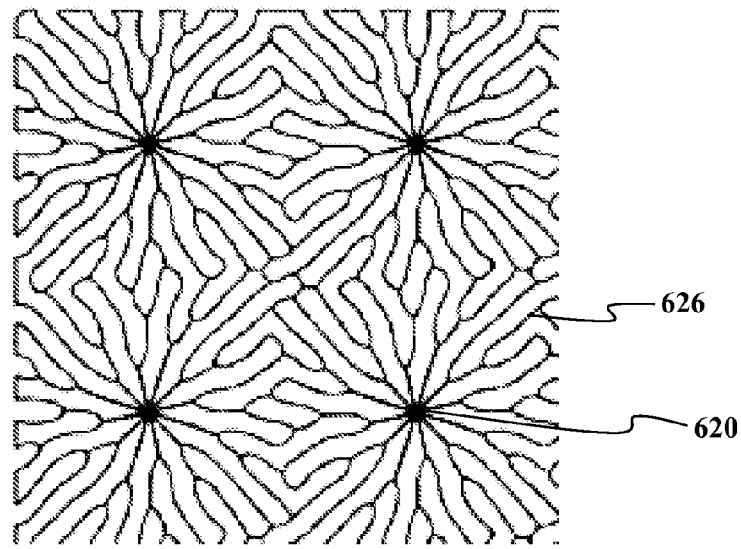
FIGS. 7-9 show various trace patterns according to embodiments of the present invention.

Referring now to FIG. 7, another aspect of the present invention will now be described. This embodiment of the present invention relates to the provision of low-cost structures and materials for photovoltaic cells which yield low shadowing and resistive losses from conductors facing the incoming sunlight, and which facilitate series interconnection.

Transparent conductor (TC) layers, particularly solution coated, traditionally have a level of resistivity that creates undesired electrical losses in a photovoltaic device. One known way to address this resistivity issue is to apply a thin conductive trace to the TC. The trace, which may be made of highly conductive metal having a resistivity, for example, in the vicinity of about $1-50\times10^{-6}$ Ω·cm. In known devices using conventional traces, the area (shadowing) loss in such an optimized structure is about 11%, and the total is about loss 19% with a TC sheet resistance of 40 Q/square. Unfortunately, even with printed traces, fingers, or grids, there is still loss of efficiency for two reasons. First, the fingers are opaque and so present a shadow to the photovoltaic material underneath. Second, the fingers have a finite resistance which leads to some power dissipation. These factors have an optimum, since minimizing shadowing implies narrower fingers, while minimizing resistance implies larger fingers. Furthermore, very small fingers tend to be impractical to fabricate because they require expensive techniques. Although the highest conductivity traces may be obtained from vacuum deposited metals, the method requires expensive deposition systems as well as patterning.

Referring now to FIGS. 1 and 7, although the structure of the present invention greatly reduces the conductivity requirement for the TC, it is advantageous to have even greater reductions, which may be achieved by the provision of fingers which are narrower (and hence less obstructive of light) than those conventionally used. By proper configuration of the size and shape of such fingers, traces, or grids, small losses on the order of about 10% or less can be achieved with a TC having sheet resistance of as large as about 200 Ω/sq., which is more than 10 times as large as required by conventional structures. In another embodiment, the total losses from finger shadowing and electrical resistance is about 5% or less. The ZnO or TC thickness may be reduced to 50-250 nm.

Referring to FIG. 7, the traces 626 may interconnect multiple vias 620 of the EWT structure to reduce the overall sheet resistance. It should be understood that a variety of patterns or orientations for the traces 626 may be used as shown in FIG. 7 and as previously shown in FIGS. 2B-2D. By way of non-limiting example, the vias 620 may be spaced about 1 centimeter apart from one another with the traces 626 connecting each contact with its nearest neighbor or in some cases to the transparent conductor surrounding it. The traces 626 may have a width between about 1 micron and about 200 microns, preferably between about 5 microns and about 50 microns. Wider lines imply a larger separation in order to avoid excessive shadowing loss.

Calculations show that for typical commercially available materials for traces such as but not limited to conductive epoxies with resistivities in the range of $1-10\times10^{-5}$ Ωcm, linewidth is a critical factor, and widths as small as about 25 microns are desirable, which leads to a shadowing loss of about 2.5% at 1 mm spacing. The vertical thickness of the lines may be about 1 to about 20 microns in height. In one embodiment of the present invention, the separation of lines is ideally in the vicinity of about 1 to about 2 mm, and the length about 0.5 mm. The sheet resistance of the traces may be below about 150 mΩ/square, and ideally not more than about 50 mΩ/square. Various combinations of width, spacing, length, thickness and resistivity of the traces around these values can be used to achieve comparably small total losses. As a non-limiting example, in other embodiments with larger linewidths, the cross-sectional area of the fingers, traces, or grids are such that they achieve a total loss of about 10% or less. The overall cross-sectional area may reduce the electrical loss in a manner sufficient to compensate for loss related to increased shadowing from any increase in linewidth. In one embodiment, the cross-sectional area of the traces are sized so that the sheet resistances of the fingers is between about 150 mΩ/square and about 50 mΩ/square. In substantially all cases, the advantage of printing such traces is the large reduction in thickness and/or conductivity required from the transparent conductor, which thereby provides major reductions in both materials and fabrication equipment costs and optical % transmission losses from the transparent conductor.

In another embodiment of the present invention, to obtain 25 micron linewidths on properly prepared substrates, a variety of techniques such as but not limited to gravure printing may be used to provide the desired linewidth. Screen printing may also be used to provide line heights from about 5- about 25 microns or more, giving rise to a third dimension of variability in line width while maintaining conductivity. In one embodiment, the line height may be in the range of non-screen printed traces may be about 1 to about 10 microns. In one embodiment, the line height may be in the range of non-screen printed traces may be about 2 to about 6 microns. In another embodiment, the line height may be in the range of about 3 to about 5 microns. Because screen printing typically uses higher viscosity materials, it is capable of thicker deposits than other techniques, and when properly applied can provide narrow lines of width less than 50 microns.

Figure 8:
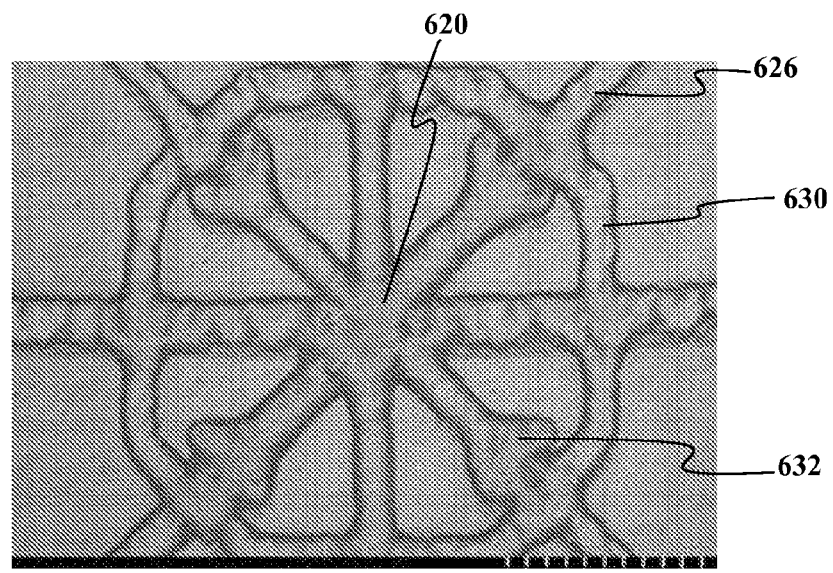
Figure 9:
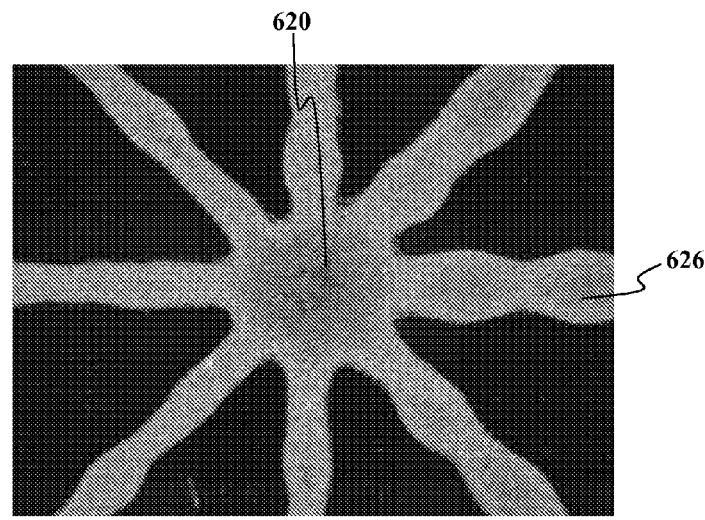

FIGS. 8 and 9 show other possible trace configurations. For example, FIG. 8 shows multiple intersecting traces 626 converging at a via 620. A hexagonal shaped trace 630 may also be used to intersect multiple traces 626 extending away from via 620. The linewidths may be in the ranges discussed above to achieve the desired. In one nonlimiting example, Nominal60 !lm wide lines, actual line-width150-200 !lm. Sheet resistance may be about 1 Q/sq. The pattern may also include bumps 632 which has wider linewidths for certain sections of the traces 626. Optionally, some trace patterns may be without the bumps 632. FIG. 9 shows a pattern where a plurality of traces 626 radiate away from a via 620. It should be understood that embodiments of the invention using these patterns may have linewidths in the range of about 5 to about 50 microns. In another embodiment, linewidths may be between about 70 and about 110 microns; sheet resistance 50 mΩ/sq. Some embodiments may have linewidths between about 20 to about 30 microns to provide total losses of about 10% or less.

Via Formation and Insulation

Figure 10:
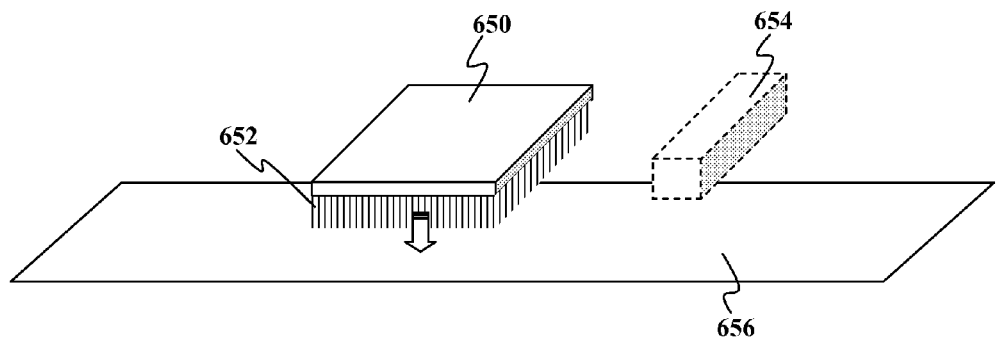
FIG. 10 shows a via hole forming devices according to embodiments of the present invention.

Referring now to FIG. 10, yet another embodiment of the present invention will now be described. To maintain high throughput processing, devices and methods are also provided for rapidly creating and insulating vias used in the aforementioned high-efficiency cell configuration.

In one aspect, it should be understood that to make the EWT solar cell configuration economically viable, a method of fabricating large numbers of small vias rapidly in the substrate is desired. A practical manufacturing line desires throughput on the order of several square meters per minute. It would be highly impractical to do this in silicon wafers. In embodiments of the present invention, vias may be advantageously formed at these speeds in metal foils of a few thousandths of an inch thickness by mechanical punching units which punch many vias simultaneously, or by laser ablation. FIG. 10 shows one embodiment of a punching device 650 for use with the present invention. It includes a punch device 650 that may include a plurality of penetrating members 652 to create a plurality of via holes simultaneously. In other embodiments, a laser device 654 (shown in phantom) may optionally be used to ablate a plurality of via holes in the substrate 656. Still further embodiments may include, but are not limited to, punch, laser, or other hole forming devices that create each via hole individually instead of in a simultaneous, batch process.

The top conductor of thin film solar cells is often composed of a doped form of ZnO, which is a relatively brittle material that when sheared by a punch breaks cleanly rather than deforming. If this or any other TC used deforms so that there is a significant probability of the formation of electrical contacts between the TC and the bottom conductor (which is only 1-2 microns vertical distance away), it is desirable to remove the TC before punching. This may be accomplished in the case of ZnO by a short exposure to mild acid, for example acetic acid (although other acids may also be used). The acid is printed by a droplet dispenser into holes in a polymer screen which is temporarily laminated to the top of the device foil and held by tension until the acid is removed by rinsing. This removal process is especially useful if the vias are formed by laser ablation, since laser heating tends to melt the ZnO and all surrounding materials at the same time, and can possibly cause shorts.

Although not limited to the following, while there exists a range of values of several of the parameters available for choice, it is desirable that the diameter of the vias should not exceed 1 mm, and should be preferably smaller. For example, if the diameter of the vias is 1 mm and the via spacing 10 mm, the fractional loss due to via area is 0.8%; at 0.5 mm diameter it is 0.2%. However, at 1.5 mm diameter the loss is 1.8%.

Figure 11A:
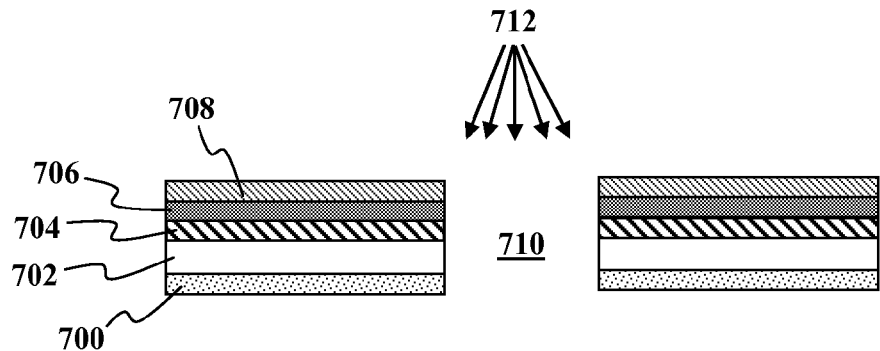
FIGS. 11A-11D show a method for forming an insulating layer according to embodiments of the present invention.

Referring now to FIGS. 11A-11D, embodiments of techniques for rapidly insulating at least the sidewalls of these vias will now be described. FIG. 11A is a cross-sectional view showing a transparent conductor 700, a photovoltaic layer 702, a bottom electrode 704, insulating layer 706, and a liner 708. This device of FIG. 11A is an intermediate device with a via hole 710 that is not insulated. FIGS. 11A-11D show one method according to the present invention of insulating the via hole 710.

As seen in FIG. 11A, the arrows 712 show the direction from which the insulating material will be sprayed. This spray may be applied using a variety of techniques including but not limited to an aerosol technique. The arrows 712 show that the spray is actually coming from an "underside" of the intermediate solar cell device. In this particle embodiment, the entire device has been flipped upside down to facilitate the spray process (i.e. the transparent conductor 700 is on the bottom of the stack). It should be understood that in other embodiments, the spray may come from the other direction or from both sides, sequentially or in combination. The spray of insulating material may also be applied without flipping the entire stack upside down in the manner shown in FIG. 11A. The insulating material may be EVA, PVOH, PVA, PVP, or another insulating material such as any thermoplastic polymer which has good adhesion to the metal foils 704 and 718. The EVA is preferably supplied as an emulsion of about 40-65% by weight in water. After application it is dried for about 90 seconds at 60-90 deg. with a Tg<150° C.

Figure 11B:
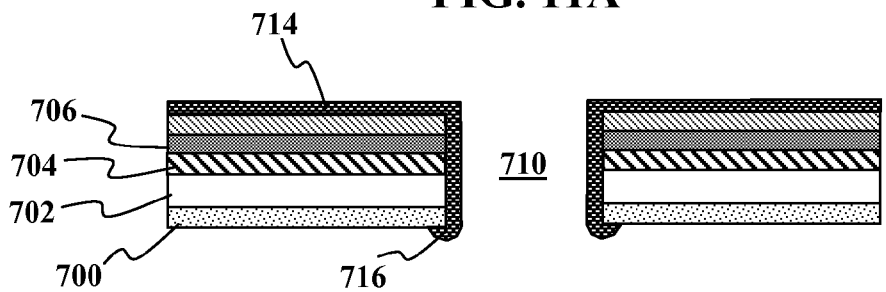
Figure 11C:
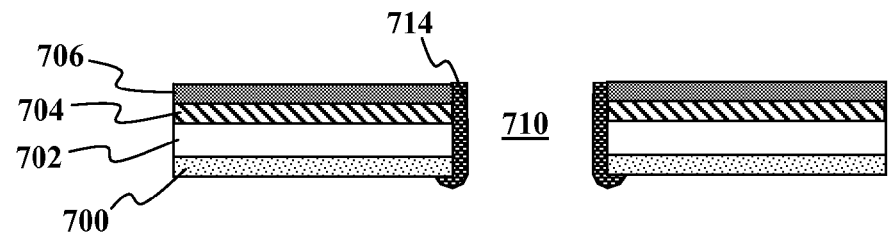

Referring now to FIG. 11B, the spray of insulating material as indicated by arrows 712 creates an insulating layer 714 that covers at least the side walls of the via hole 710. The insulating layer 714 may optionally be oversprayed to cover some portion of the transparent conductor 700 to ensure that the insulating layer fully insulates the sidewalls of the via hole 710. The overspray portion 716 may also improve adhesion of the insulating layer 714 to the stack of layers FIG. 11C shows the liner 708 may be removed to remove the bottom layer of the insulating material 714. Optionally, it should be understood that the layer 708 may actually comprise of a plurality of discrete layers such as but not limited to a liner layer, an adhesive layer, and a liner layer. This may create a liner with better release qualities and/or adhesive qualities for the materials that they are in contact with. One liner material may interact better with one material than the other. This allows the liner to be optimized for the desired qualities. Still further, the layer 708 may have a plurality of discrete layers comprising of a liner layer, an adhesive layer, a PET or electrically insulating layer, an adhesive layer, and a liner layer configuration which guarantees election insulation by having the PET or electrically insulating layer.

Figure 11D:
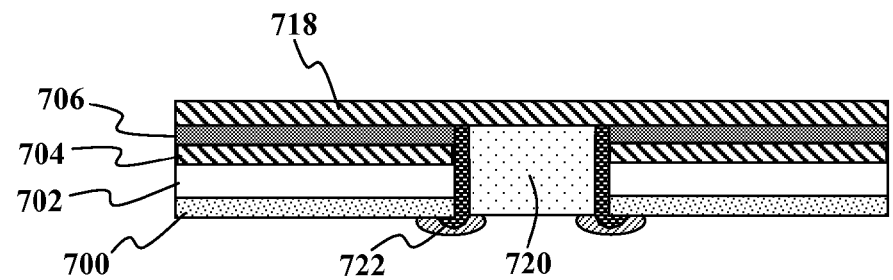

FIG. 11D shows that with liner 708 removed, the backside electrode 718 may be applied to the underside of the stack. The stack is now cured in order to cause good adhesion of the backside electrode to the insulating layer. In the case of EVA, the cure takes place at about 150 C for about 20 min. It should be understood that in some embodiments of the present invention, the backside electrode 718 may be a foil of material that covers the entire backside. The via hole 710 is filled with a conductive material 720 and fingers 722 are coupled to the conductive material 720.

Figure 12A:
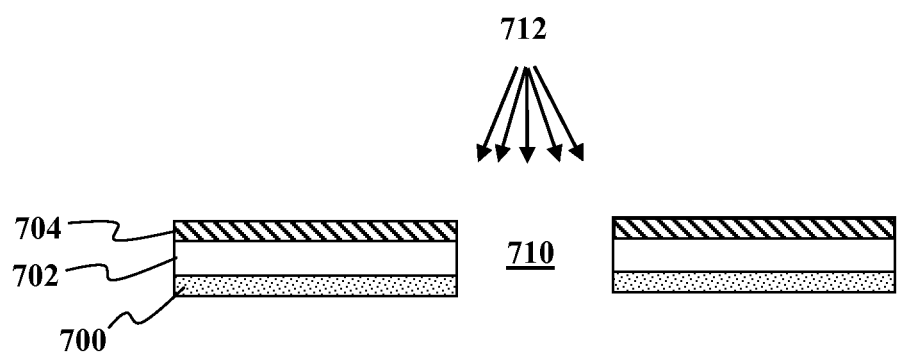
FIGS. 12A-12C show a method for forming an insulating layer according to embodiments of the present invention.
Figure 12B:
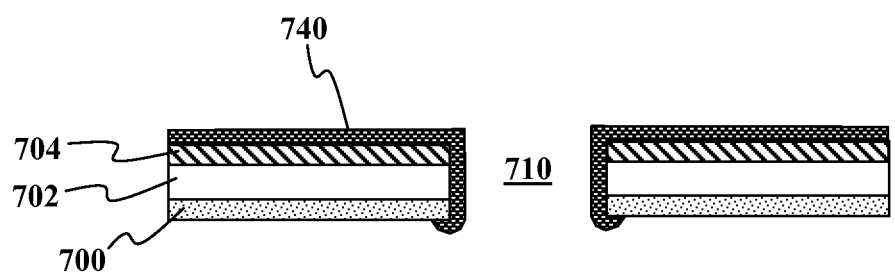
Figure 12C:
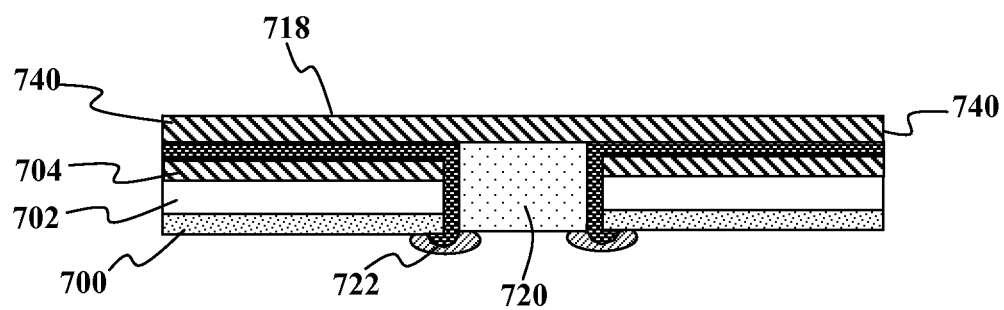

Referring now to FIGS. 12A-12C, yet another embodiment of the present invention will now be described. As seen in FIG. 12A, the stack of layers to be sprayed with insulating material does not include the liner 708 found previously in FIG. 11A. In the present embodiment, the insulating material also includes an adhesive quality. Hence, the insulating layer 740 when formed will not need to be removed from the underside and liner 708 is not needed, nor is insulating layer 706. Arrows 712 shows that the insulating material may be sprayed on using an aerosol technique to cover the sidewalls of the via hole 710 and the underside of the layer 706.

FIG. 12B shows that the insulating layer 740 forms a layer covering the sidewall of the via hole 710 and along substantially the entire backside of layer 706. This simplifies the number of steps as there is no need to have a liner removal step or prior application of an insulating layer. The backside electrode layer 718 (FIG. 12C) may be applied directly to the layer 740.

FIG. 12C shows that once the backside electrode layer 718 may be applied and a conductive material 720 added to form an electrical connection via the traces 722 to coupled the transparent conductor layer 700 to the backside electrode 718 while being insulated from bottom electrode 704 by the insulating layer 740.

Figure 13A:
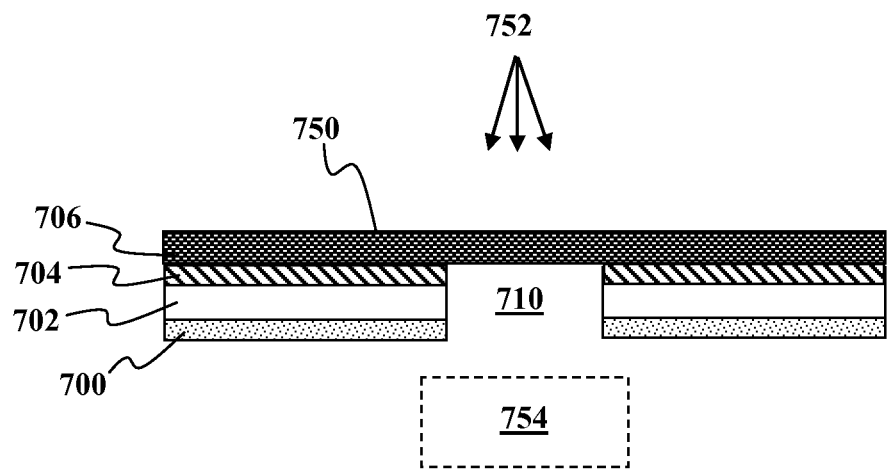
FIGS. 13A-13C show a method for forming an insulating layer according to embodiments of the present invention.
Figure 13B:
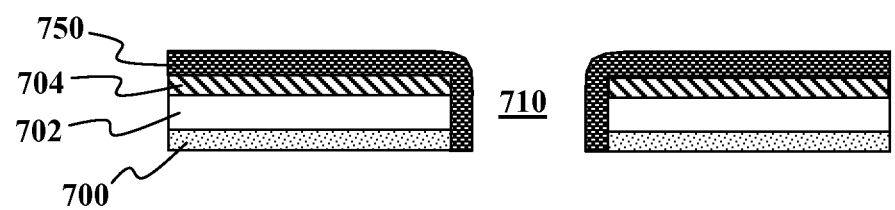

Referring now to FIGS. 13A-13B, a still further embodiment of the present invention will now be described. This embodiment of the invention describes another method of forming the insulating layer along the sidewalls of a via hole. As seen in FIG. 13A, a substantially uniform layer 750 of insulating material is formed along a backside of layer 106. Optionally, this layer 750 includes adhesive qualities to facilitate the attachment of the backside electrode layer 770. The layer 750 flows into the via and covers the side walls in a thickness comparable to its thickness on the bottom electrode 704. The exact thickness of the coating on the sidewall will depend to some extent on the aspect ratio of the via (the ratio of via diameter to foil thickness) as well as on the viscosity of the coating solution. In one embodiment, there is sufficient material to provide a layer between about 20 to about 100 microns thick along the wall of the via hole 710. It should be understood that some material from layer 750 may also fill part or all of the via hole 710. For ease of illustration, the layer 750 is depicted as extending over the via hole. A gas source as indicated by arrows 752 may be used to direct or flow the material from layer 750 into the via hole 710. Optionally, the source may blow gas, inert gas, or air. Still further, it should be understood that instead of blowing gas, a vacuum source 754 (shown in phantom) may be used instead or in combination with the gas source.

The layer 750 may be formed of sufficient thickness so that there is sufficient material to flow into the via and cover the side walls without being too thin and without filling the entire via hole. In one embodiment, the device may have a layer thickness in the range of about 50-100 microns. In another embodiment, the device may have a layer thickness in the range of about 50-100 microns. In another aspect, there is sufficient material in the layer 750 to coat the sidewalls of the via holes with insulating material about 20 to about 100 microns thick.

As seen in FIG. 13B, the via hole 710 remains open while the insulating layer 750 is formed by drawing the material towards the sidewalls in the via hole 710. The via hole 710 remains open to allow a conductive material 720 to be filled into the via hole 710. This method of printing a uniform layer may allow for a thicker layer of the insulating layer 750 to be formed along the walls of the via.

Figure 13C:
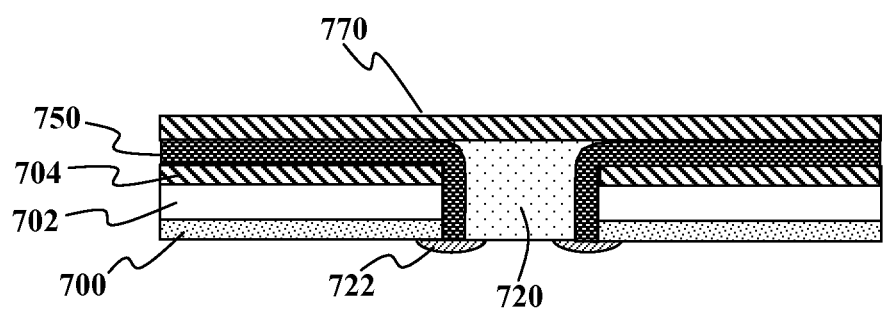

FIG. 13C shows that the backside electrode layer 770 may be coupled to the layer 750. The via hole 710 is filed with an insulating conductive material 720 and is coupled to fingers 722 which electrically couples the transparent conductor 700 to the backside electrode 770.

It should be understood of course that the methods using spraying and the methods using air impingement (via positive and/or negative pressure) are combinable in single or multiple steps. As a nonlimiting example, the spray-on application of insulating material may be subsequently treated by air impingement (via positive and/or negative pressure) to ensure that any material that may occlude a via hole from the spray on application are directed to coat the sidewalls of the via or to ensure that the sidewalls are fully coated. Optionally, in another nonlimiting example, insulating material applied using the uniform coating and air impingement technique may be supplemented with spraying insulating material onto at least the sidewalls of the via hole if the layer is not of a desired thickness. In yet another nonlimiting example, an initial layer of insulating material may be sprayed onto the sidewall of the via holes and then a uniform coating may be applied to using the air impingement technique to further thicken the insulating layer. In still other embodiments, two spray-on steps may be used to build up layer thickness. Another embodiment may use to coating steps (with air impingement after each coat) to build up the desired thickness.

Series Interconnections Formed By Using Selectively Patterned Support

Figure 14:
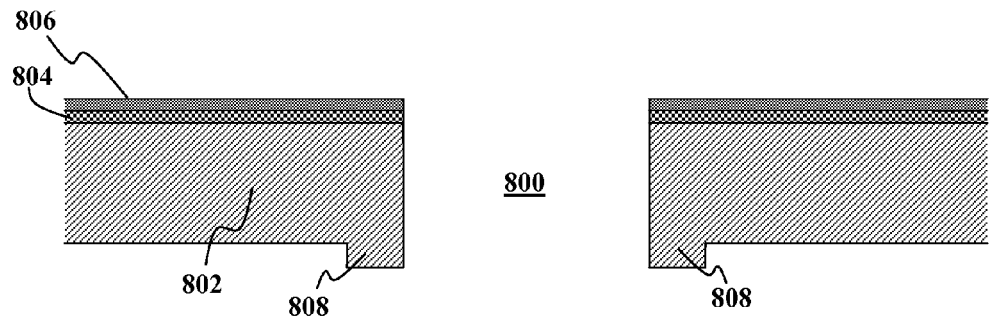
FIGS. 14 though 16 show cross-sectional views of various vias according to the embodiments of the present invention.

Referring now to FIG. 14, various devices and methods for use in rapidly assembling solar cell modules will now be described. The aforementioned high efficiency solar cells are well suited for use with the following assembly techniques. It should be understood, however, that these techniques are not limited to the photovoltaic devices described in the foregoing paragraphs but can be suitable for use with other cell configurations.

The embodiment of FIG. 14 shows a process flow for use with the advanced packaging architecture to produce fully interconnected modules ready for encapsulation. Optionally, these cells in these modules are serially interconnected. In this embodiment of the invention, one of the first steps involves forming a plurality of vias 800 in layers 802, 804, and 806. Although not limited to the following, one suitable low cost technique for forming the vias involves punching. The layer 802 represents a bottom electrode which carries charge from the active layer 804 (which may comprise of a P-type layer and an N-type layer forming a PN junction). The layer 806 may be a transparent conductive layer for gathering electrical charge. Although the present invention describes these as being punched, it should be understood that these vias may also be formed by other methods such as but not limited to lasing, drilling, and/or any other suitable hole forming technique. Some embodiments may also be preformed with the desired openings. FIG. 14 shows a cross-section of a via 800 and suggests the possibility of a defect and/or burr 808 from punching, which will be covered by insulator applied as shown in FIG. 15.

Figure 15:
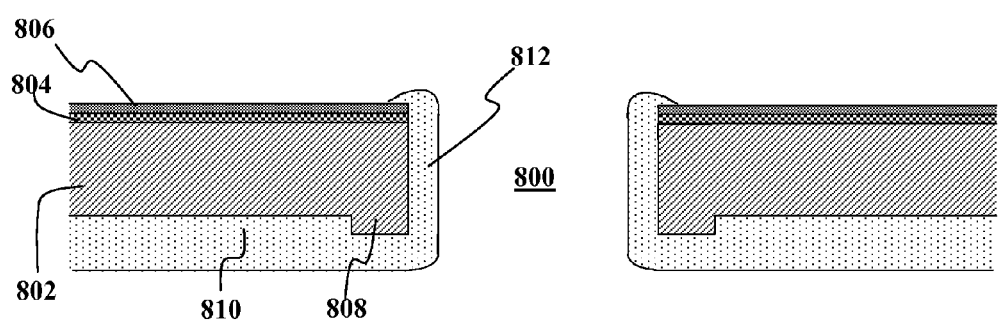

FIG. 15 shows the application of a backside insulator 810 and via insulator 812. The insulator 810 and via insulator 812 may be formed by any of the methods described in the foregoing. One suitable method is by spraying of insulating material from the backside to form backside insulator 810 and via insulator 812. Of course, other deposition techniques may also be used. These may include a variety of non-vacuum techniques such as but not limited to wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink-jet printing, jet deposition, spray deposition, and the like, as well as combinations of the above and/or related technologies. Although not limited to the following, the insulator material may be partially cured before the next step. Other embodiments may use more thorough and/or total curing.

Figure 16:
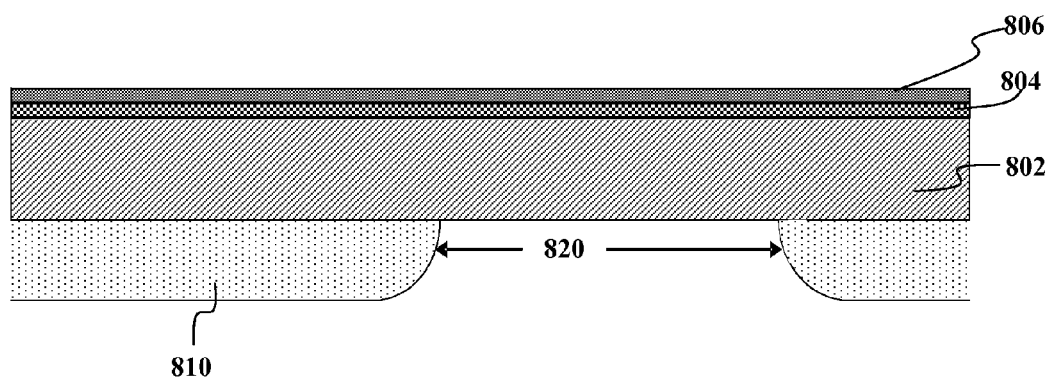
Figure 17:
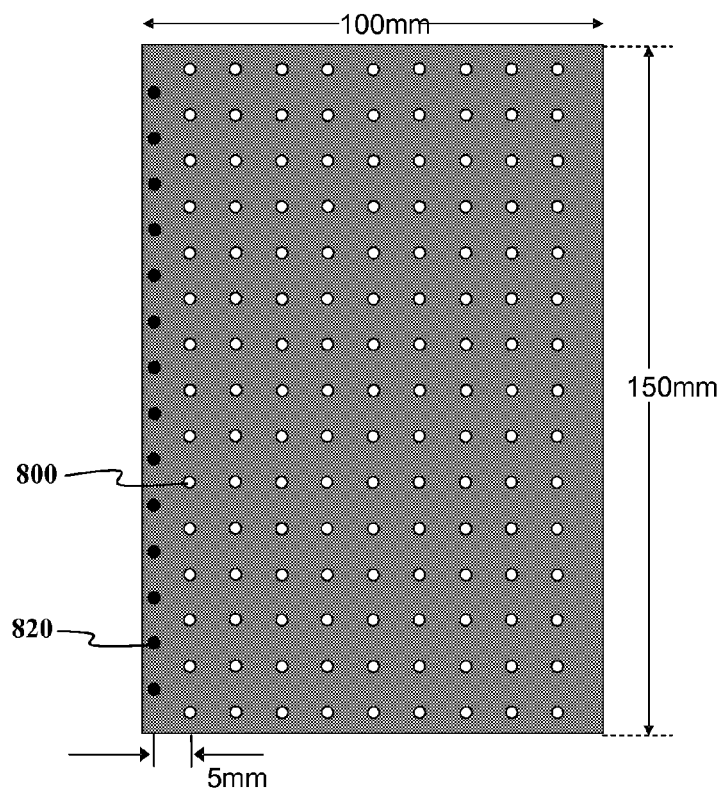
FIG. 17 shows a top down view of a photovoltaic device according to embodiments of the present invention.

Referring now to FIGS. 16 and 17, at least one series interconnect via 820 is formed in the insulator 810. The via 820 may be formed through the insulator 810, but in this present embodiment, it does not extend through the bottom electrode 802. Optionally, in other embodiments, the via 820 may extend partially into the bottom electrode 802 and portions of the bottom electrode 802 may be removed. The via 820 is formed so that enough insulating material from insulation 810 is removed to allow the via 820 to be filled with an electrically conductive material to form an electrical connection to the bottom electrode 802. If the via 820 is formed by etching, it can be done by either solvent application from an inkjet, laser ablation, or a combination thereof. In one example of a combination technique, solvent may be used for most of it and then cleanup with the laser. Optionally, the etching is done before final curing of the insulator; perhaps before any curing.

As seen in FIG. 17, these series interconnect vias 820 may be formed in a single line along one edge of a cell, and staggered with respect to the EWT vias, so neither longitudinal nor transverse cross-sections through the device will intersect both simultaneously. Although not limited to the following, the layout for a 150×100 mm cell is shown in FIG. 17. The open circles are EWT vias 800 (which penetrate the entire structure as shown in FIGS. 14 and 15), and the closed circles are series interconnect vias 820, which preferably penetrate only the backside insulator 810 and stop on the bottom electrode 802. For ease of illustration, the series interconnect vias 820 are shown in FIG. 17. It should be understood, however, that these vias 820 are located along an underside of the cell and not necessarily visible from the topside. The diameter of a series interconnect vias 820 may be larger than the EWT vias 800. In one embodiment, the vias 820 are about 1 mm diameter. In other embodiments, the vias 820 may range between about 0.5 mm to about 2 mm in diameter. In the present embodiment, they are designed to fit within the 5 mm strip defined by the edge of the cell and the first row of EWT vias 800. The space is variable depending on the size of the solar cell and the spacing of electrically insulating areas on the backside support. In one embodiment, the EWT vias 800 may be spaced apart from one another by about 10 mm. It should be understood of course that the EWT vias 800 may be formed in configurations other than a single line. As a nonlimiting example, the vias 820 may be in a curved line configuration, a zig-zag line configuration, other geometric configurations, and/or combinations thereof so long as they are electrically isolated from the vias 800 except by way of the transparent conducting electrode 806.

Figure 18:
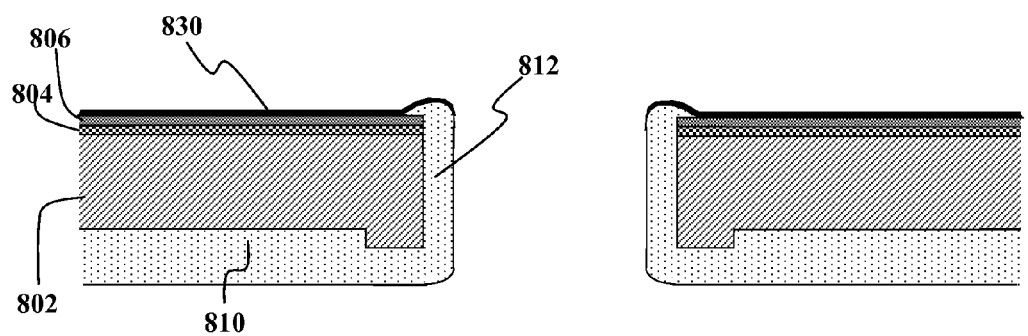
FIG. 18 shows a cross-sectional view of a photovoltaic device according to embodiments of the present invention.

Referring now to FIG. 18, print conducting traces 830 for augmenting the TCE layer 806 may be formed by a variety of techniques including, but not limited to, gravure or screen printing. These may include a variety of non-vacuum techniques such as but not limited to wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink jet printing, jet deposition, spray deposition, and the like, as well as combinations of the above and/or related technologies. They are shown here as seen in the via 800 cross-section of FIG. 15, where the process is designed so that the ink will not print a significant distance into the via 800. Optionally, some embodiments of the present invention may have the traces 830 extend further into via 800 to promote better electrical connection with electrically conductive material that will fill the via 800 (see FIG. 26).

If the cells are formed from a continuous roll of material, the individual cells may be formed by first slitting and/or cutting the cells from the continuous roll and then sheeting, testing, and sorting. The slitting or cutting may also apply to large planar substrates that are not continuous rolls but are formed in an oversized manner and then slit to form a plurality of smaller cells.

After the cells are formed, the cells may be tested and sorted. The testing may involve characterizing the conversion efficiency of the cell and other properties. The sorting of cells allows those with higher operating efficiencies and those at other efficiencies to be grouped with other cells having similar efficiencies. In this manner, the selection of cells for use in a module may be optimized.

Figure 19:
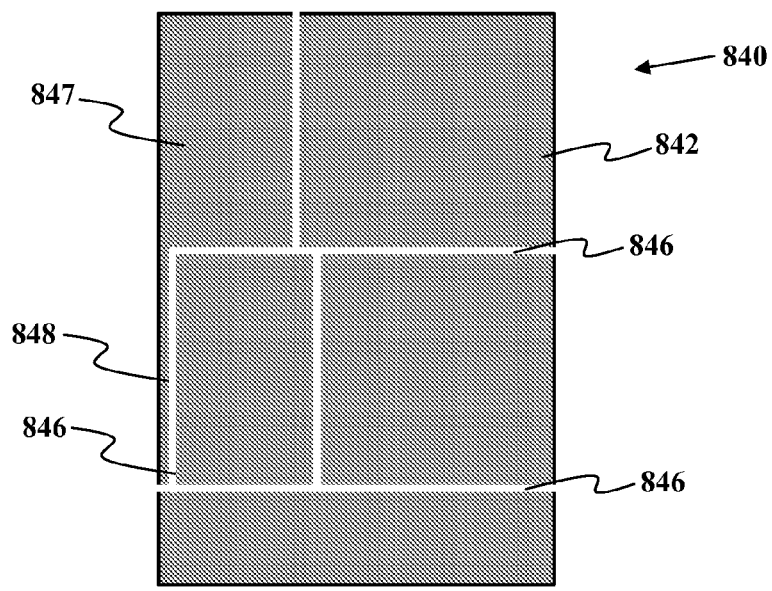
FIG. 19 is a top down view of a patterned support according to embodiments of the present invention.

Referring now to FIG. 19, the support 840 on which cells will be mounted may be patterned to have electrically conductive areas and electrically nonconductive areas. The support may be a single layer or a multi-layer support. The single layer may have areas of electrically conductive material and areas of electrically nonconductive material. Multi-layer supports may also have defined areas of electrically conductive material and areas of electrically nonconductive material. Some may have one layer of conductive material over a layer of nonconductive material, wherein portions of the conductive material are etched or otherwise removed to create electrically insulating gaps.

Although not limited to the following, the support 840 may be a backside conductor laminate (BCL). In one embodiment, creating the support 840 may involve laminating a metal foil 842 to a polymer carrier 844 (see FIG. 20) and then patterning the polymer to form backside conductor laminate. The pattern will create gaps 846 in certain areas of the metal foil to allow electrical connections to be made from the metal foil to select areas on the solar cells, while isolating other areas. It should be understood that the metal foil may comprise of a variety of materials including but not limited to aluminum, copper, silver, steel, stainless steel, molybdenum, or other electrically conductive materials. Although not limited to the following, Cu or Al are acceptable metals; Cu is better known in the flex circuit industry so laminates may be more readily available, and the cost/conductivity tradeoff may even be advantageous. Although not limited by the following, the thickness of the metal may be at least 25 µm for Al and cells of 4" extend in the string direction; Cu could be thinner (or the cells longer) in order to keep resistance losses to less than 1%.

Figure 20:
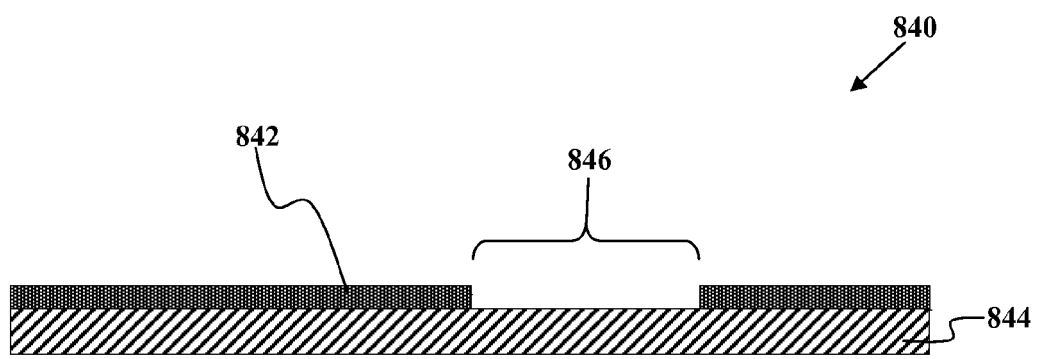
FIG. 20 is a cross-section view of a patterned support according to embodiments of the present invention.

Referring now to FIGS. 19 and 20, the support 840 shows that the metal foil 842 may be patterned with gaps 846 in the electrically conductive foil 842 which shows the underlying polymer carrier 844. In some embodiments, these gaps 846 may be filled with or comprise of polymer insulator. In other embodiments, they may be unfilled gaps. The pattern of the gaps 846 in support 840 may pass through the metal foil 842 and in some areas, it may optionally, pass through the polymer carrier 844. FIG. 20 shows a cross-sectional view where the gap 846 in the metal foil 842 is clearly shown and that the metal foil 842 is supported by the polymer carrier 844. The gaps 846 create breaks that allow current to flow through the metal foil 842 and attached solar cells in a series interconnected manner. Without the gaps 846, undesired current paths may be created and the flow of current may not be in a series interconnected manner. In one embodiment of the present invention, the BCL 840 may consist of nominally 25 µm Al foil laminated (preferably hot laminated) to a carrier plastic, which may be PET or any other material to become part of the backsheet. The metal foil 842 may be patterned as shown in FIG. 19 by laser, etching, or other suitable technique.

FIG. 19 also shows one embodiment of a BCL support 840 patterned so that a U-turn connection can made between one string of cells to another string via backside electrical connections on support 840. More specifically as seen in FIG. 19, the piece 846 is an inverted L-shaped piece with a pan-handle portion 848. The pan-handle portion will be in contact with a cell along the second string while the remaining L-shaped portion of piece 846 is in electrical contact with a cell along a first string. This allows for solar cells along a first string to be electrically connected by backside electrical connections on support 840 to a second string of solar cells. For ease of illustration, FIG. 19 is shown without any solar cells mounted to the patterned support 840.

Referring now to FIG. 21, this embodiment of the invention more clearly shows how the cells 850 are positioned in contact with support 840 to provide a series interconnection. The series interconnect vias 820 are positioned on one side of a gap 846 so that electrical current will be directed into the cell 850 by way of the vias 820. The gap 846 may also be viewed as method of separating vias 820 on one cell from vias 820 on another cell. The cells 850 bridge these gaps 846 and thus each cell 850 provides a path for electrical current to span these gaps 846. Thus, the electrical current travels along the backside support 840, then through a cell 850, through the backside support 840, then through a cell 850, etc. This alternating path creates a series interconnection between cells. Without the gaps 846 or comparable insulator between vias 820 of various cells, vias 820 from one cell may be connected to vias 820 on another cell 850 by way of the backside support 840 and thus a parallel connection will be created instead of a series connection as multiple current paths may be created and the electrical current need not pass through each cell in series. The gaps 846 also segment the backside connector to separate the vias 820 from the vias 800 on the same cell 850. Thus, current must flow through the cell to complete a series interconnection.

Referring now to the embodiment of FIG. 21, the cells 850 are positioned such that the cells 850 span and straddle the gaps 846. Preferably, the location of the cells 850 and the gaps 846 in support 840 also separate vias 820 on one cell from vias 800 on the same cell. Cells with the pattern of vias as shown in FIG. 17 are laid onto the BCL foil with the single row of series interconnect vias placed near the edge of the underlying cut. In this way the BCL 840 serves as both backside electrode (for the EWT) and series interconnect conductor. By way of example and not limitation, the first row of EWT vias 800 may be no more than 5 mm from the edge of the cell (assuming that the EWT via spacing is 10 mm). This leaves a 5 mm strip in which to locate the series interconnect vias. If the cells in this embodiment are placed 0.5 mm apart, then one has 4.5 mm of total overlap, allowing plenty of space for 1-2 mm diameter vias.

Although not limited to the following, it is desirable to provide series interconnects whose resistance is substantially less than that of the cell string. The formula for the fraction of generated power that is dissipated in the electrodes is the following:

$$P_d = (L_o^2/2)(J_o/V_o)(\rho_t/d_t + \rho_b/d_b)$$

in which $L_o$ is the length of a cell, $J_o$ and $V_o$ the current density and voltage at maximum power, $\rho$ the resistivity of the electrodes (t and b refer to top and bottom, respectively), and d the thickness of the electrodes. This equation is derived without considering the resistance of the interconnects (i.e. they are taken to have no resistance) which is acceptable if in fact that resistance is small with respect to the derived terms.

For the case of aluminum ($\rho \sim 3 \times 10^{-6}$ Ωcm), 100 µm bottom electrode and 25 µm "top" electrode (it lies underneath the bottom electrode but it is the electrical surrogate for the top electrode of the solar cell), the larger of the two resistance terms is $\rho_t/d_t \approx 1$ mΩ. In the configuration of FIG. 22, the section of BCL which carries current from one cell to another is 2.5 mm long, 25 µm thick, and 15 cm wide, with a resistance of 0.02 mΩ so the condition is satisfied. This calculation does not consider the contact resistance of the silver-ink filled vias, but there appears to be a sufficient margin of safety. This issue must be considered for any printed contact, however. For ease of illustration, the external contacts are not shown, but are easily incorporated in this design. They would consist of metal tabs inserted into the structure just like cells.

Figure 23:
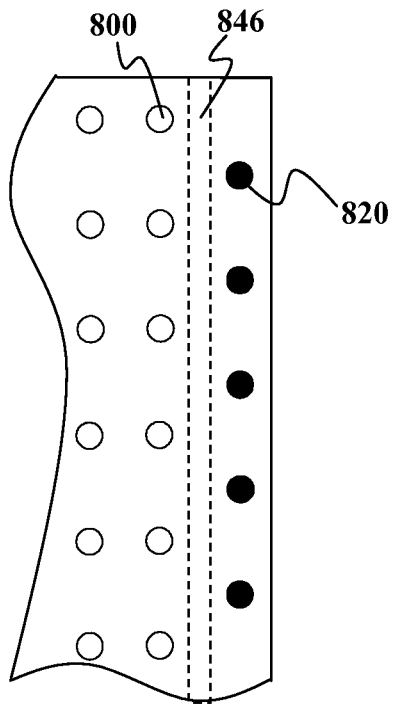
FIG. 23 shows a close-up, top down view of a photovoltaic device relative to a gap in the underlying support according to an embodiment of the present invention.

FIG. 23 more clearly shows that the gap 846 (shown in phantom) is located on the backside support 840 between the vias 820 and the vias 800. Again, the gap 846 may optionally be filled with an electrically insulating material. Optionally, the gap 846 may simply by sized and/or spaced sufficiently far from the vias 800 and 820 to provide the desired insulating property.

Figure 24:
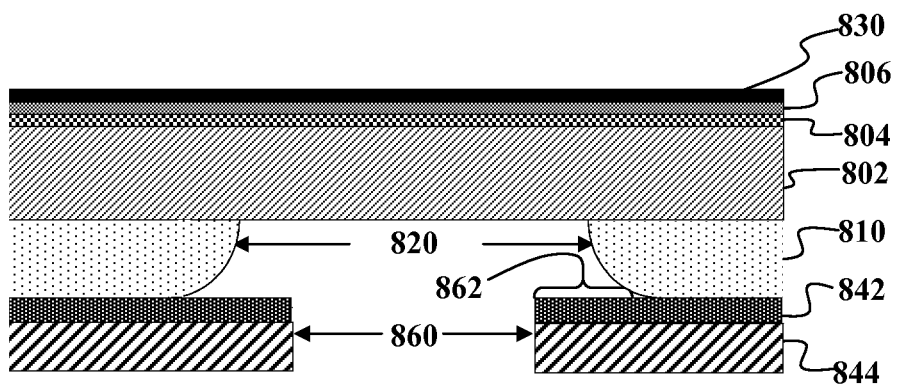
FIG. 24 shows a cross-sectional view of a via in a photovoltaic device according to an embodiment of the present invention.

Referring now to FIG. 24, a cross-sectional view of the cell 850 on the support 840 is shown. FIG. 24 shows a section of cell 850 with the via 820. The via 820 will be filled with a conductive material. This may occur either before the cell 850 is attached to the support 840 or after the cell 850 is attached. If the filling of the vias 820 occurs after attachment of the cell 850, then vias 820 need to be accessible. Although not limited to the following, one method of accessing the vias 820 involves forming access holes 860 in the support 840 for series interconnect connections. This forming of access holes 860 may occur before and/or after the cell 850 is attached to the support 840. Some embodiments may involve forming a portion of the access holes 860 which may act as pilot and/or guide holes prior to placements of cells and forming additional access holes afterwards. The formation of the access holes in support 840 may include method such as, but not limited to, mechanical punching, laser drilling, drilling, other similar techniques, or any combination of the foregoing.

As seen in FIG. 24, the access holes 860 may have diameters that are narrower than the via 820. This is so that when the via 820 is filled with conductive ink or paste, there is contact to more surface area than just the sidewall of the via, which in this particular embodiment is only about 25 µm thick and may not provide sufficient strength. Even a small differential in diameters will provide far greater surface area for adhesion. The diameter is still large enough that rotary punching with standard tools will suffice. The diameters of the access holes 860 may be anywhere from about 20% to about 100% of the size of the via 820. In other embodiments, the holes 860 will be between about 40% to about 70%. The difference in size will create an overhang area 862 that will increase surface area contact with the material filling the via and also provide structural support to retain the via filling material in the via.

It is desirable to form access holes 860 in the BCL 840 for the series interconnect in order to keep the BCL electrode and the backside insulator substantially completely coplanar, as shown. Alternatively, dots of adhesive may also be used to connect the two, but some irregular spaces may result and create voids that may increase the risk of adhesive failure.

Figure 25:
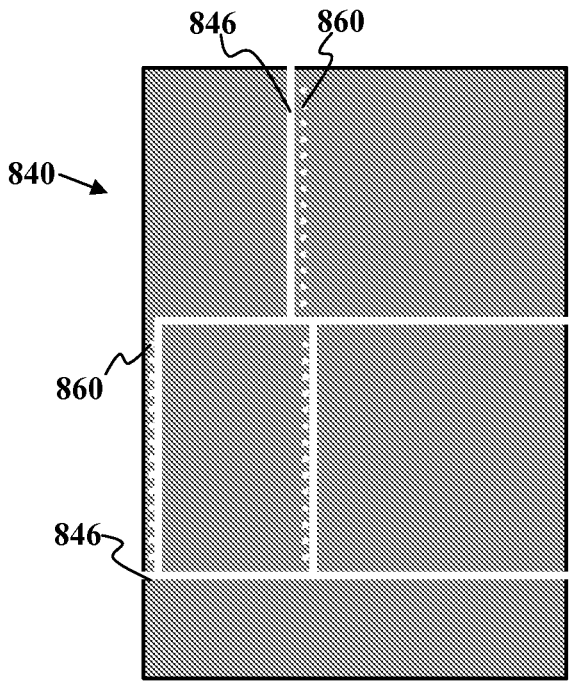
FIG. 25 is a top down view of a support with a plurality of openings according to an embodiment of the present invention.

FIG. 25 shows that the support 840 may have a plurality of access holes 860 formed through the support 840. Although not limited to the following, each of the vias 820 preferably has at least one access hole 860 aligned to correspond to the position of the via 820. These access holes 860 may be formed before attachment of the cells 850 or after the cells 850 are attached. Attachment of the cells 850 to the support 840 may be by lamination, adhesion, other known attachment techniques, or any combination of the foregoing. The cells 850 are placed with sub-mm spatial precision on the roll of support 840. If the backside insulator has been correctly chosen, it will bond to Al (with the aid of heat and pressure, analogous to the usual module lamination process with EVA), so no other adhesive is needed. The process tool probably requires sheeting of the support 840 (to module size), followed by cell placement and then lamination in a tool similar to a conventional module laminator.

Figure 26:
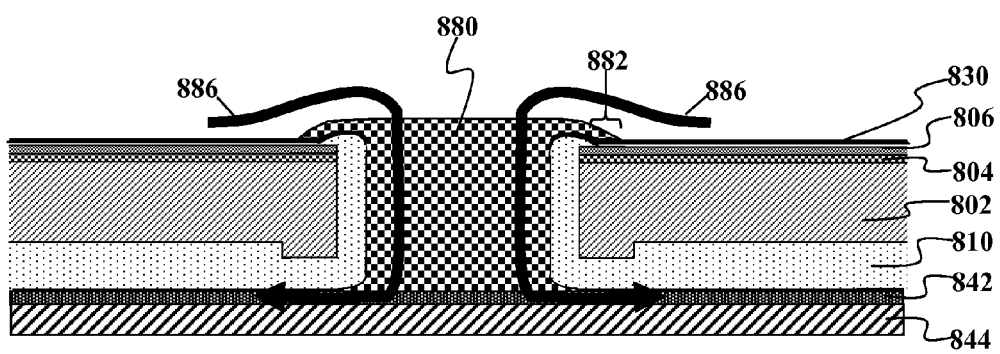
FIGS. 26 and 27 show vias filled with conductive material according to embodiments of the present invention.
Figure 27:
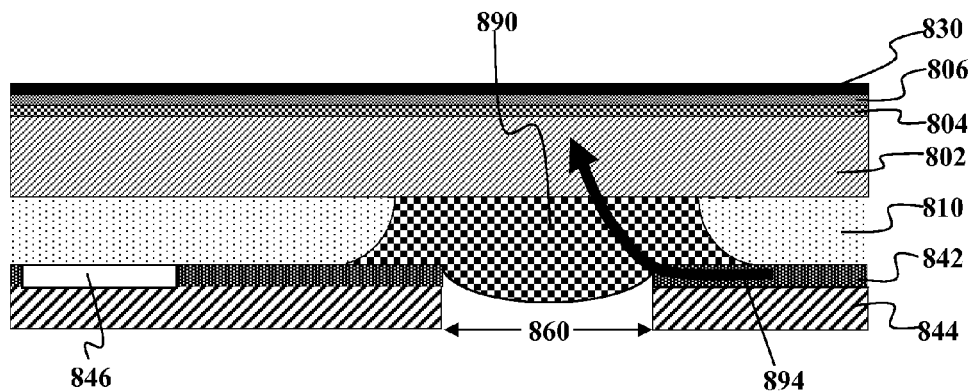

Referring now to FIGS. 26 and 27, one embodiment of the present invention for filling the vias 800 and 820 with conductive material will now be described. In this embodiment, via conductor ink, paste and/or solder will be printed in two steps: 1) one step from the top for the EWT vias 800, and 2) one step from the bottom for the series interconnect vias 820. These filling steps may occur simultaneously and/or sequentially. If necessary, the access holes 860 may be capped with a printed insulator. However, when this structure is combined with the backsheet and front encapsulant, these spaces or access holes 860 will probably be filled in automatically.

FIG. 26 shows that the via 800 may be filled with conductive material 880 such that the via 800 is substantially filled and that there is sufficient contact between the material 880 and the fingers 830. Optionally, it should be understood that in some embodiments, the vias 800 may be pre-filled prior to placement on the support. This contact area 882 allows for contact with the fingers so that electrical current can flow from the fingers and/or transparent conductive layer to the conductive material in via 800 down to the backside conductor 842. This flow is indicated by arrows 884.

FIG. 27 shows that the series interconnect via 820 may be filled with a conductive material 890 such that the via 820 is substantially filled and that there is sufficient contact between the material 890 and the conductor 842. The filling of the via 820 and/or the filling of via 800 may be achieved by using a variety of non-vacuum techniques such as but not limited to wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink-jet printing, jet deposition, spray deposition, and the like, as well as combinations of the above and/or related technologies. Optionally, it should be understood that in some embodiments, the vias 820 may be pre-filled prior to placement on the support and not need the access opening 860. Some embodiments may have blobs or balls of conductive material placed on the support which fills the vias 820 and may also avoid the need for openings 860.

As seen in FIG. 27, the conductive material 890 in the via 820 allows electrical current to flow from the backside conductor 842 through the material 890 and to the backside electrode 802. The gap 846 and insulator 810 prevent the electrical current from flowing along the backside conductor 842 and directs current into the cell 850 to create a series interconnection where current flows from backside conductor 842, into the cell 850, then back down to the backside conductor 842, then into another cell 850, etc. . . .

After the cells 850 are coupled to the support 840 and the vias filled, there remains the step of forming end interconnects and encapsulate. In one embodiment, this process results in an interconnected module ready for final packaging, and needs only encapsulation, provision of external connectors, and mounting system. The assembly may optionally be laminated to a stiffening backing or other suitable material.

Figure 28A:
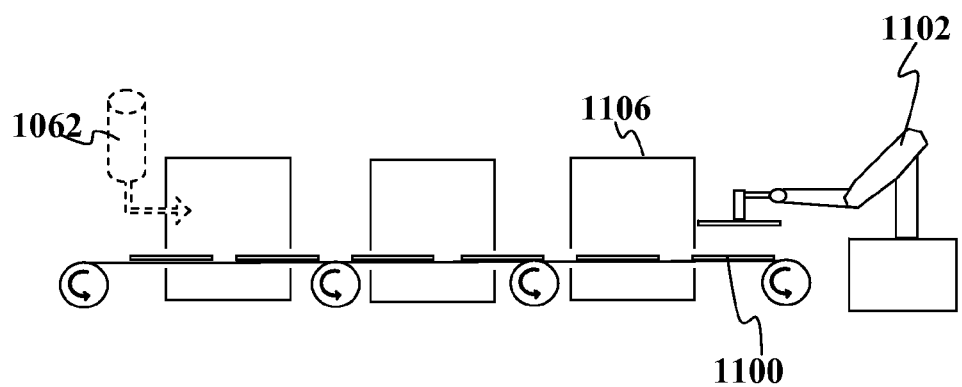
FIG. 28A shows one embodiment of a system for use with rigid substrates according to one embodiment of the present invention.

Referring now to FIG. 28A, it should also be understood that the embodiments of the present invention may also be used on a rigid substrate 1100 and is not limited to flexible, roll-to-roll substrates. By way of nonlimiting example, the rigid substrate 1100 may be glass, soda-lime glass, steel, stainless steel, aluminum, polymer, ceramic, coated polymer, or other rigid material suitable for use as a solar cell or solar module substrate. A high speed pick-and-place robot 1102 may be used to move rigid substrates 1100 onto a processing area from a stack or other storage area. In FIG. 28A, the substrates 1100 are placed on a conveyor belt which then moves them through the various processing chambers. Optionally, the substrates 1100 may have already undergone some processing by the time and may already include a precursor layer on the substrate 1100. Other embodiments of the invention may form the precursor layer as the substrate 1100 passes through the chamber 1106.

Figure 28B:
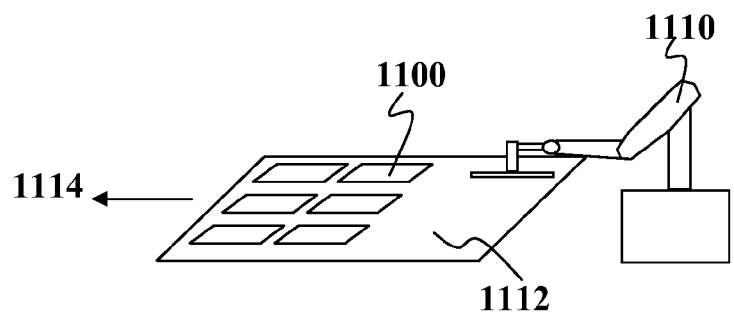
FIG. 28B shows one embodiment of a system for use with rigid substrates according to one embodiment of the present invention.

FIG. 28B shows another embodiment of the present system where a pick-and-place robot 1110 is used to position a plurality of rigid substrates on a carrier device 1112 which may then be moved to a processing area as indicated by arrow 1114. This allows for multiple substrates 1100 to be loaded before they are all moved together to undergo processing.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, with any of the above embodiments, the use of spray on insulating material may also be combined with other printing techniques to apply various layers of material to the solar cell. In one embodiment, insulation material may be provided by spray-on technique while the filing of the via may occur by printing, or vice versa.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a size range of about 1 nm to about 200 nm should be interpreted to include not only the explicitly recited limits of about 1 nm and about 200 nm, but also to include individual sizes such as 2 nm, 3 nm, 4 nm, and sub-ranges such as 10 nm to 50 nm, 20 nm to 100 nm, etc.

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited. For example, U.S. patent application Ser. No. 11/039,053, filed Jan. 20, 2005 and U.S. patent application Ser. No. 11/207,157 filed Aug. 16, 2005, are fully incorporated herein by reference for all purposes. PCT Application Ser. No. PCT/US2007/063745 filed Mar. 10, 2007 is also fully incorporated herein by reference for all purposes.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method comprising:
   forming a solar cell having a high efficiency backside electrode configuration, wherein the solar cell comprises of:
   at least one transparent conductor, an photovoltaic layer, and at least one bottom electrode;
   coupling the solar cell to a backside electrode, wherein an electrically insulating layer is positioned between the solar cell and the backside electrode, wherein the electrically insulating layer is formed by application of an insulating aerosol comprising of elements of a purely dielectric nature and an adhesive component, and wherein the backside electrode is patterned to provide a series interconnection between the solar cell and at least one other solar cell supported by the backside electrode coupled to a conductive core in substantially each of a plurality of via holes extending through at least the photovoltaic layer, the bottom electrode, and the electrically insulating layer without direct electrical contact with the bottom electrode;
   wherein the backside electrode has a pattern of electrically conductive areas and electrically nonconductive areas to create series interconnection between solar cells electrically coupled by the support and prevents parallel connections between the solar cells;
   wherein a plurality of interconnect via holes that extend through the electrically insulating layer and having with an electrically conductive material form an electrical connection between the bottom electrode and one of the electrically conductive areas on the backside electrode that extends beneath the solar cell and an adjacent solar cell.

2. The method of claim 1 further comprises using a source that sprays insulating material from an underside of the solar cell to avoid substantially covering the transparent conductor with insulating material.

3. The method of claim 1 further comprises spraying an insulating material from an underside of the solar cell to minimize amount of material deposited on the transparent conductor without using a mask on the transparent conductor.

4. The method of claim 1 further comprising spraying a sufficient amount of insulation to coat walls of the via holes without completely filling the via holes.

5. The method of claim 1 further comprising spraying a sufficient amount of insulation to coat the via walls of the via holes and to coat the underside of the bottom electrode to form the electrically insulating layer.

6. The method of claim 1 further comprising forming an insulating layer by application of aerosol to the via holes.

7. A method comprising:
   forming a solar cell having a high efficiency backside electrode configuration, wherein the solar cell comprises of:
   at least one transparent conductor, an photovoltaic layer, and at least one bottom electrode;
   coupling the solar cell to a backside electrode, wherein an electrically insulating layer is positioned between the solar cell and the backside electrode and wherein the backside electrode is patterned to provide a series interconnection between the solar cell and at least one other solar cell supported by the backside electrode coupled to a conductive core in substantially each of a plurality of via holes extending through at least the photovoltaic layer, the bottom electrode, and the electrically insulating layer without direct electrical contact with the bottom electrode; and
   spraying the via holes with insulating material and using gas impingement after spraying of the via holes to clear any via holes occluded by insulating material;
   wherein the backside electrode has a pattern of electrically conductive areas and electrically nonconductive areas to create series interconnection between solar cells electrically coupled by the support and prevents parallel connections between the solar cells;
   wherein a plurality of interconnect via holes that extend through the electrically insulating layer and having with an electrically conductive material form an electrical connection between the bottom electrode and one of the electrically conductive areas on the backside electrode that extends beneath the solar cell and an adjacent solar cell.

8. A method comprising:
   forming a solar cell having a high efficiency backside electrode configuration, wherein the solar cell comprises of:
   at least one transparent conductor, an photovoltaic layer, and at least one bottom electrode;
   coupling the solar cell to a backside electrode, wherein an electrically insulating layer is positioned between the solar cell and the backside electrode and wherein the backside electrode is patterned to provide a series interconnection between the solar cell and at least one other solar cell supported by the backside electrode coupled to a conductive core in substantially each of a plurality of via holes extending through at least the photovoltaic layer, the bottom electrode, and the electrically insulating layer without direct electrical contact with the bottom electrode; and
   using gas impingement on a substantially uniform coating on one side of the solar cell to direct insulating material into each of the via holes;
   wherein the backside electrode has a pattern of electrically conductive areas and electrically nonconductive areas to create series interconnection between solar cells electrically coupled by the support and prevents parallel connections between the solar cells;
   wherein a plurality of interconnect via holes that extend through the electrically insulating layer and having with an electrically conductive material form an electrical connection between the bottom electrode and one of the electrically conductive areas on the backside electrode that extends beneath the solar cell and an adjacent solar cell.

9. The method of claim 1 further comprising forming a plurality of electrical conduction fingers on the transparent conductor in the solar cell.

10. The method of claim 1 further comprising forming an insulating layer in each of the vias holes by printing a substantially uniform coating on one side of the solar cell and using suction on another side of the solar cell to pull insulating material of the uniform coating into each of the via holes and creating openings in the uniform coating corresponding to each of the via holes.

* * * * *